(12) United States Patent
Fukumitsu

(10) Patent No.: US 11,597,648 B2
(45) Date of Patent: Mar. 7, 2023

(54) MEMS DEVICE MANUFACTURING METHOD AND MEMS DEVICE

(71) Applicant: Murata Manufacturing Co., Ltd., Nagaokakyo (JP)

(72) Inventor: Masakazu Fukumitsu, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 97 days.

(21) Appl. No.: 17/158,603

(22) Filed: Jan. 26, 2021

(65) Prior Publication Data

US 2021/0147224 A1    May 20, 2021

Related U.S. Application Data

(63) Continuation of application No. PCT/JP2019/022016, filed on Jun. 3, 2019.

(30) Foreign Application Priority Data

Sep. 4, 2018   (JP) ............................. JP2018-165308

(51) Int. Cl.
*B81C 1/00* (2006.01)
*B81B 3/00* (2006.01)

(52) U.S. Cl.
CPC ........ *B81C 1/00833* (2013.01); *B81B 3/0021* (2013.01); *B81C 1/00166* (2013.01);
(Continued)

(58) Field of Classification Search
CPC ................... B81C 1/00269; B81C 2201/0143
See application file for complete search history.

(56) References Cited

U.S. PATENT DOCUMENTS 7,749,867 B2    7/2010   Fukuyo et al.
8,183,131 B2    5/2012   Fukuyo et al.
(Continued)

FOREIGN PATENT DOCUMENTS

JP    2007083309 A    4/2007
JP    2017098838 A    6/2017
(Continued)

OTHER PUBLICATIONS

International Search Report issued for PCT/JP2019/022016, dated Jul. 9, 2019.

(Continued)

*Primary Examiner* — Moazzam Hossain
(74) *Attorney, Agent, or Firm* — ArentFox Schiff LLP

(57) ABSTRACT

A MEMS device and a MEMS device manufacturing method are provided for suppressing damage to device parts. An exemplary method of manufacturing a resonance device includes radiating laser light from a bottom surface side of a second substrate to form modified regions inside the second substrate along dividing lines of a first substrate, which has device parts formed on a top surface thereof, and the second substrate, the top surface of which is bonded to the bottom surface of the first substrate via bonding portions. The method further includes dividing the first and second substrates along the dividing lines by applying stress to the modified regions. The bonding portions are formed along the dividing lines and block the laser light.

13 Claims, 16 Drawing Sheets

(52) U.S. Cl.
CPC ...... *B81C 1/00269* (2013.01); *B81C 1/00904* (2013.01); *B81B 2203/04* (2013.01); *B81C 2203/03* (2013.01)

(56) References Cited

U.S. PATENT DOCUMENTS

| | | | |
|---|---|---|---|
| 8,361,883 B2 | 1/2013 | Fukuyo et al. | |
| 8,551,865 B2 | 10/2013 | Fukuyo et al. | |
| 8,598,015 B2 | 12/2013 | Fukuyo et al. | |
| 8,673,745 B2 | 3/2014 | Fukuyo et al. | |
| 8,802,543 B2 | 8/2014 | Fukuyo et al. | |
| 2004/0188124 A1* | 9/2004 | Stark | H01L 31/0203 174/535 |
| 2005/0202596 A1 | 9/2005 | Fukuyo et al. | |
| 2006/0011593 A1 | 1/2006 | Fukuyo et al. | |
| 2010/0015783 A1 | 1/2010 | Fukuyo et al. | |
| 2012/0205358 A1 | 8/2012 | Fukuyo et al. | |
| 2013/0252402 A1 | 9/2013 | Fukuyo et al. | |
| 2013/0344686 A1 | 12/2013 | Fukuyo et al. | |
| 2014/0080288 A1 | 3/2014 | Fukuyo et al. | |
| 2015/0371966 A1* | 12/2015 | Yoshida | H01L 24/05 257/620 |

FOREIGN PATENT DOCUMENTS

| | | |
|---|---|---|
| JP | 2018004446 A | 1/2018 |
| JP | 2018063407 A | 4/2018 |
| WO | 2003076120 A1 | 9/2003 |

OTHER PUBLICATIONS

Written Opinion of the International Searching Authority issued for PCT/JP2019/022016, dated Jul. 9, 2019.

* cited by examiner

MEMS DEVICE MANUFACTURING METHOD AND MEMS DEVICE

CROSS REFERENCE TO RELATED APPLICATIONS

The present application is a continuation of PCT/JP2019/022016 filed Jun. 3, 2019, which claims priority to Japanese Patent Application No. 2018-165308, filed Sep. 4, 2018, the entire contents of each of which are incorporated herein by reference.

TECHNICAL FIELD

The present invention relates to a MEMS device manufacturing method and a MEMS device.

BACKGROUND

Currently, devices manufactured using micro-electromechanical systems (MEMS) technologies are widely used. For example, a plurality of devices are formed on a collective substrate (wafer) and then the wafer is divided into individual devices (chips).

For example, as described in Patent Document 1 (identified below), a laser processing method for dividing a wafer is known that includes a step in which laser light is radiated to the inside of a substrate 15 of a workpiece 1, which includes the substrate 15 and stacked portions 17a and 17b provided on a surface of the substrate 15, at the focal point in order to form a modified region 7 inside the substrate 15. Moreover, a cutting starting point area is formed within a predetermined distance from the laser light incident plane of the workpiece 1 along a planned cutting line of the workpiece 1 by this modified region 7 and a step in which the workpiece 1 is cut along the planned cutting line by applying stress to the workpiece 1 from the side near the stacked portions 17a and 17b after forming the cutting starting point area. In this laser processing method, a modified region 7 is formed inside the substrate 15 by radiating laser light from a rear surface 21 side of the workpiece 1, and then a modified region 7 is formed inside a stacked portion 17 by radiating laser light from a side near a surface 3 of the workpiece 1.

Patent Document 1: Japanese Unexamined Patent Application Publication No. 2007-83309.

However, in the method disclosed in the cited Patent Document 1, part of the laser light radiated from the side near of the surface 3 penetrates through to the surface of the wafer (substrate), which is the workpiece 1, on the opposite side from the side from which the laser light is incident. At a result, when device parts, for example, electrode pads or the like are formed on the opposite surface of the wafer, there is a risk of laser light that has not been absorbed by the wafer damaging the device parts formed on the opposite surface from the incident surface.

SUMMARY OF THE INVENTION

Accordingly, the exemplary embodiments of the present invention are provided in light of the above-described circumstances. I It is an object thereof to provide a MEMS device manufacturing method configured for suppressing damage to device parts and to provide a MEMS device.

In an exemplary aspect, a MEMS device manufacturing method is provided that includes radiating laser light from a second main surface side of a second substrate so that a modified region is formed inside the second substrate along a dividing line of a first substrate, which has a device part formed on a first main surface thereof, and the second substrate, a first main surface of which is bonded to a second main surface of the first substrate via a bonding portion. Moreover, the method includes dividing the first substrate and the second substrate along the dividing line by applying stress to the modified region. The bonding portion is formed along the dividing line and blocks the laser light.

According to another exemplary aspect, a MEMS device is provided that includes a first substrate having a device part formed on a first main surface thereof; and a second substrate, a first main surface of which is bonded to a second main surface of the first substrate via a bonding portion. Moreover, a material of the bonding portion is a metal constructed for blocking laser light that is able to pass through the first substrate and the second substrate.

DETAILED DESCRIPTION OF EXEMPLARY EMBODIMENTS

Hereafter, exemplary embodiments of the present invention will be described. In the following description of the drawings, identical or similar constituent elements are denoted by identical or similar reference symbols. The drawings are representative, the dimensions and shapes of the individual parts are schematically illustrated, and the technical scope of the present invention should not be interpreted as being limited to that of the embodiments.

First Exemplary Embodiment

Figure 1:
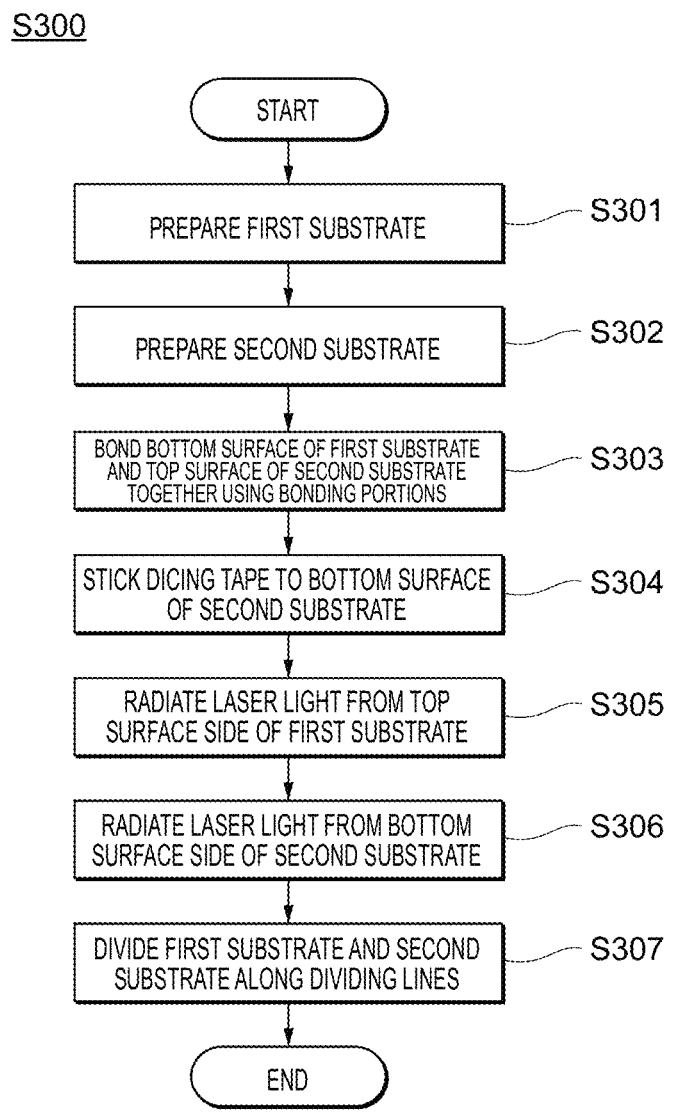
FIG. 1 is a flowchart illustrating a method of manufacturing a resonance device according to a first embodiment.
Figure 2:
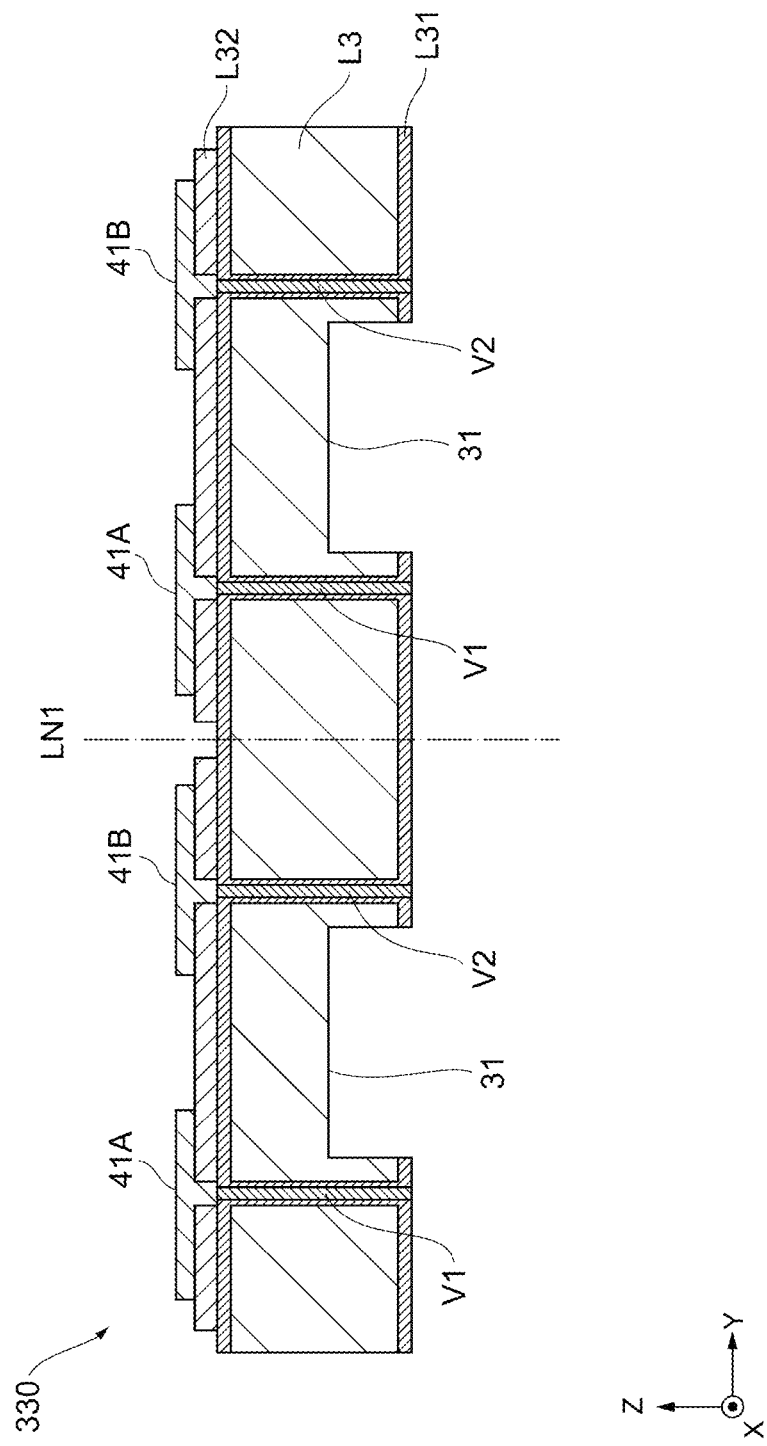
FIG. 2 is a sectional view illustrating a step depicted in FIG. 1.
Figure 3:
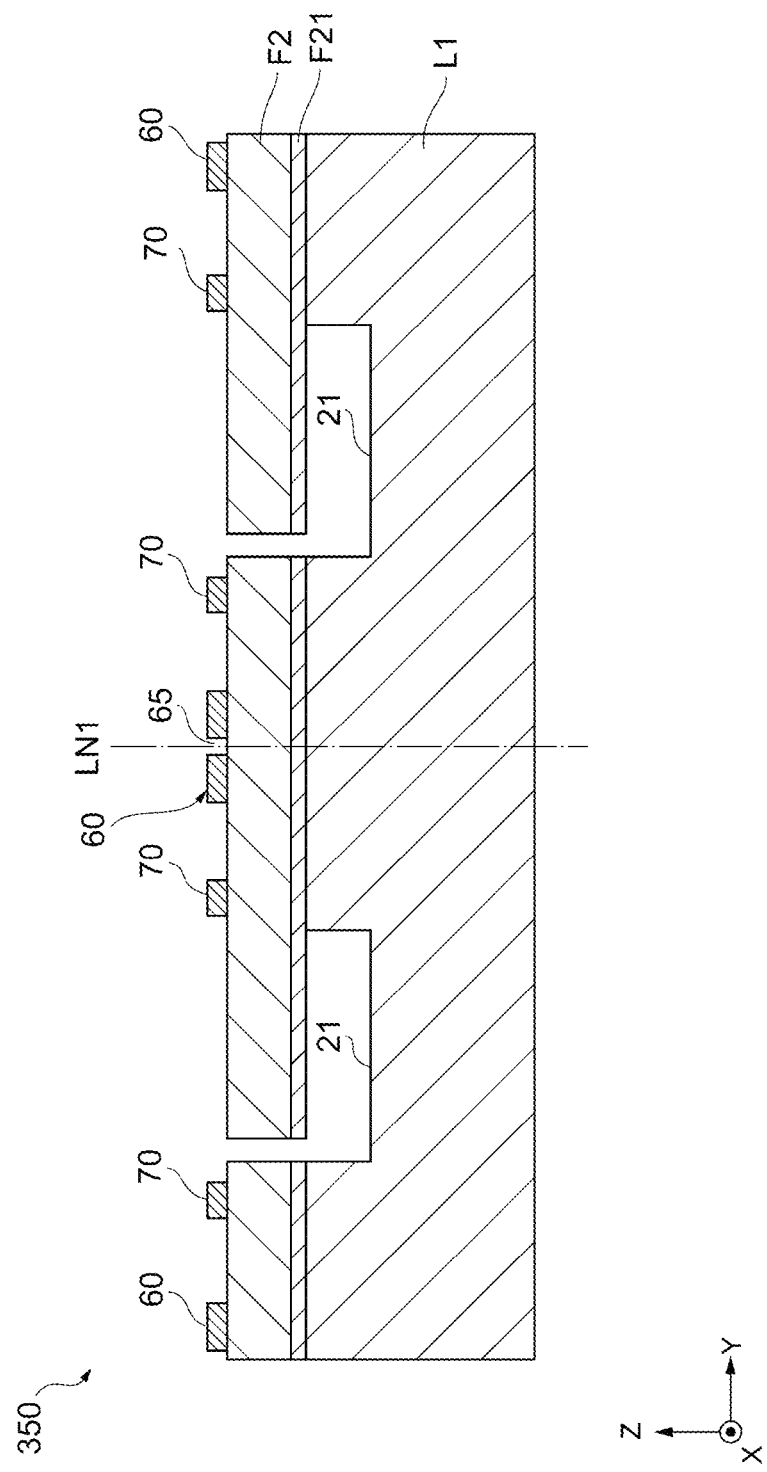
FIG. 3 is a sectional view illustrating a step depicted in FIG. 1.
Figure 4:
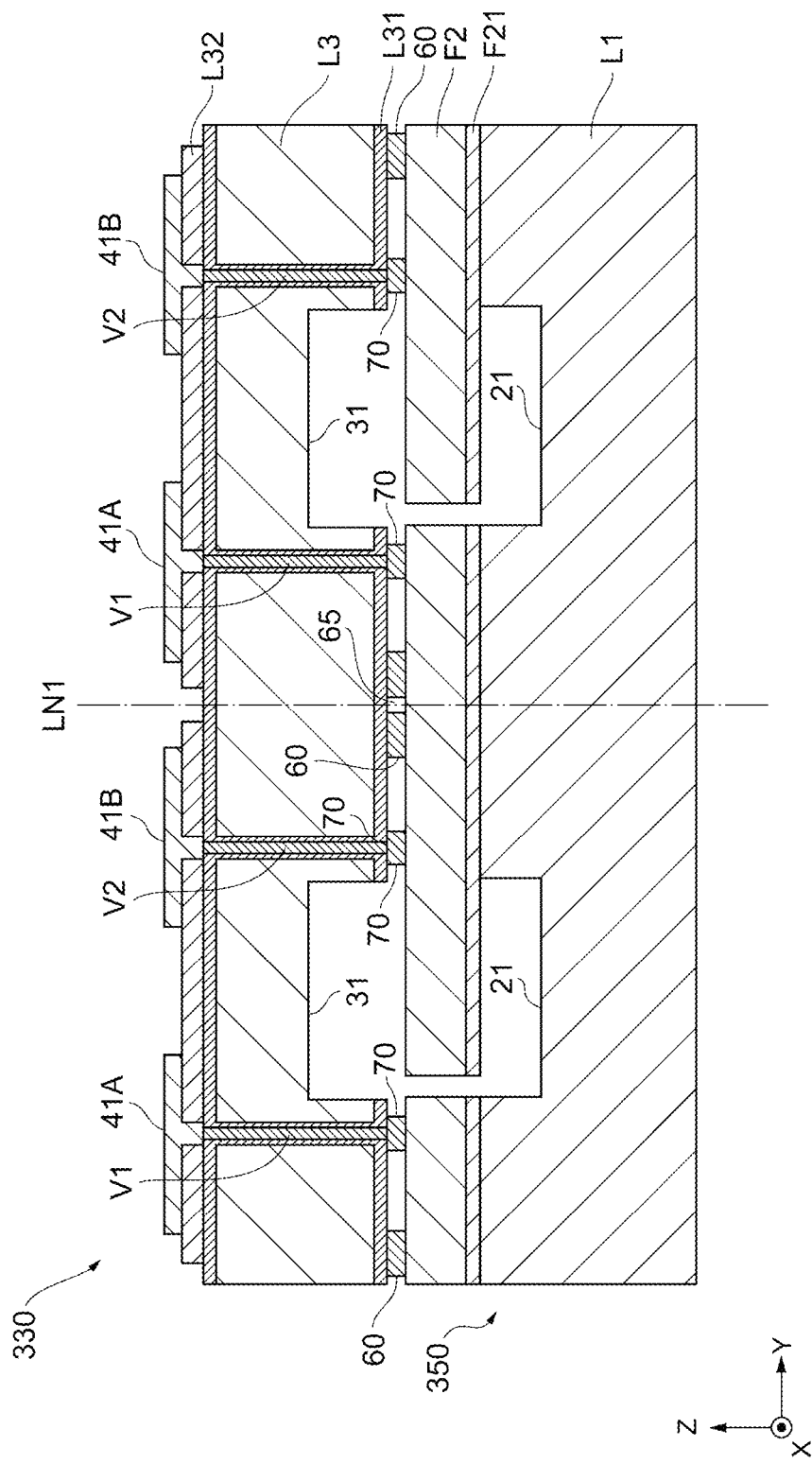
FIG. 4 is a sectional view illustrating a step depicted in FIG. 1.
Figure 5:
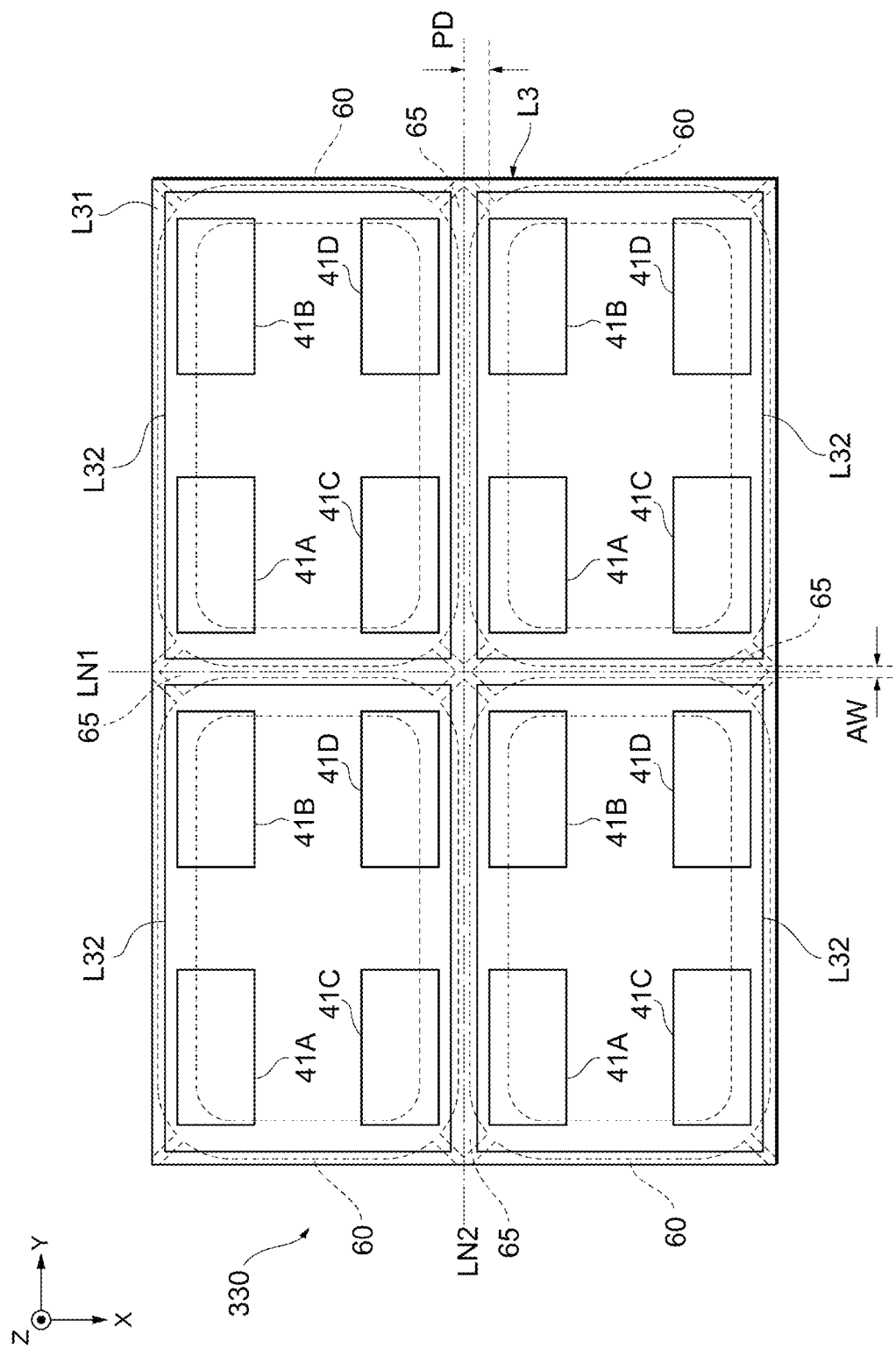
FIG. 5 is a plan view illustrating a first substrate illustrated in FIG. 4.
Figure 6:
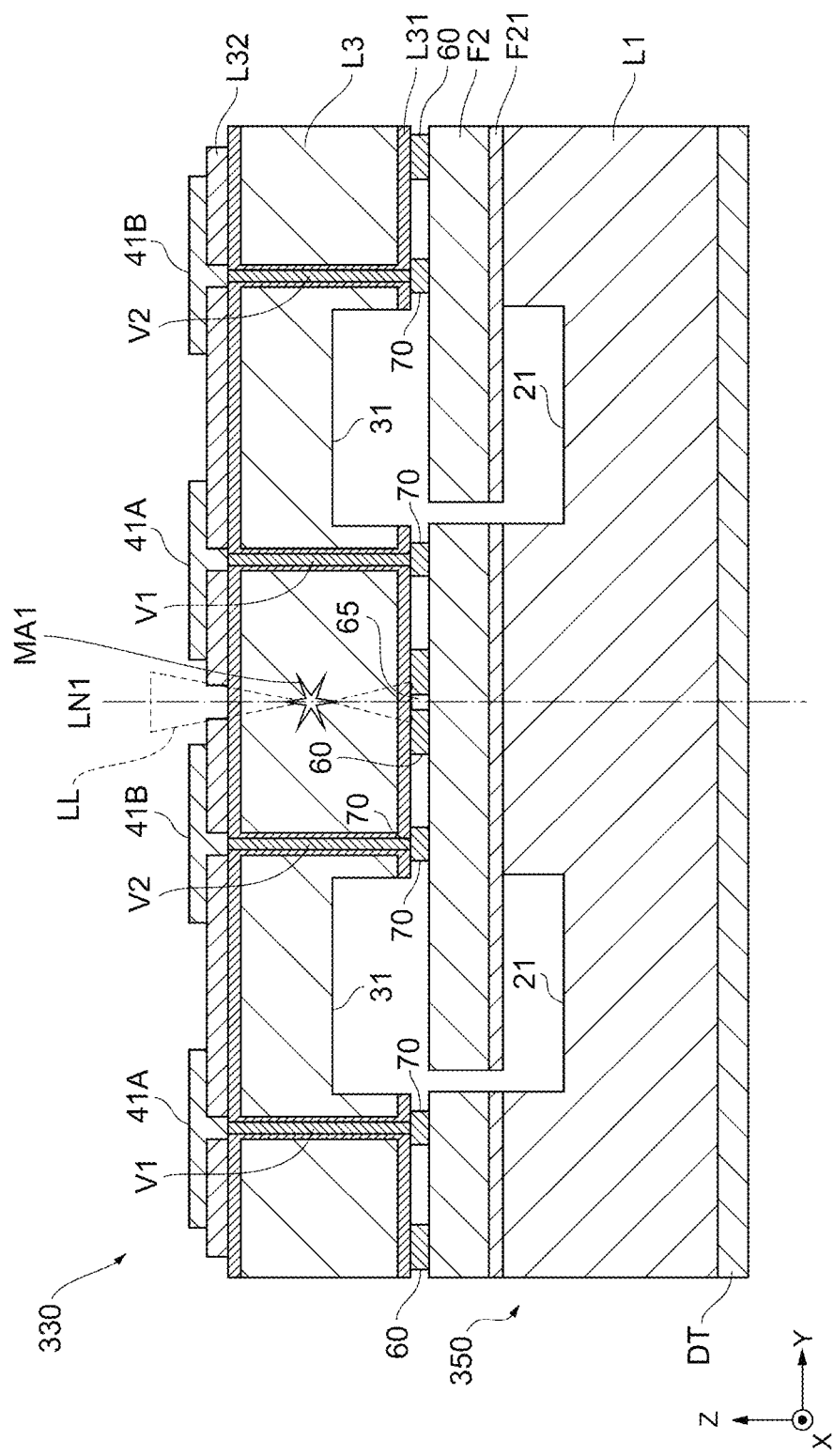
FIG. 6 is a sectional view illustrating a step depicted in FIG. 1.
Figure 7:
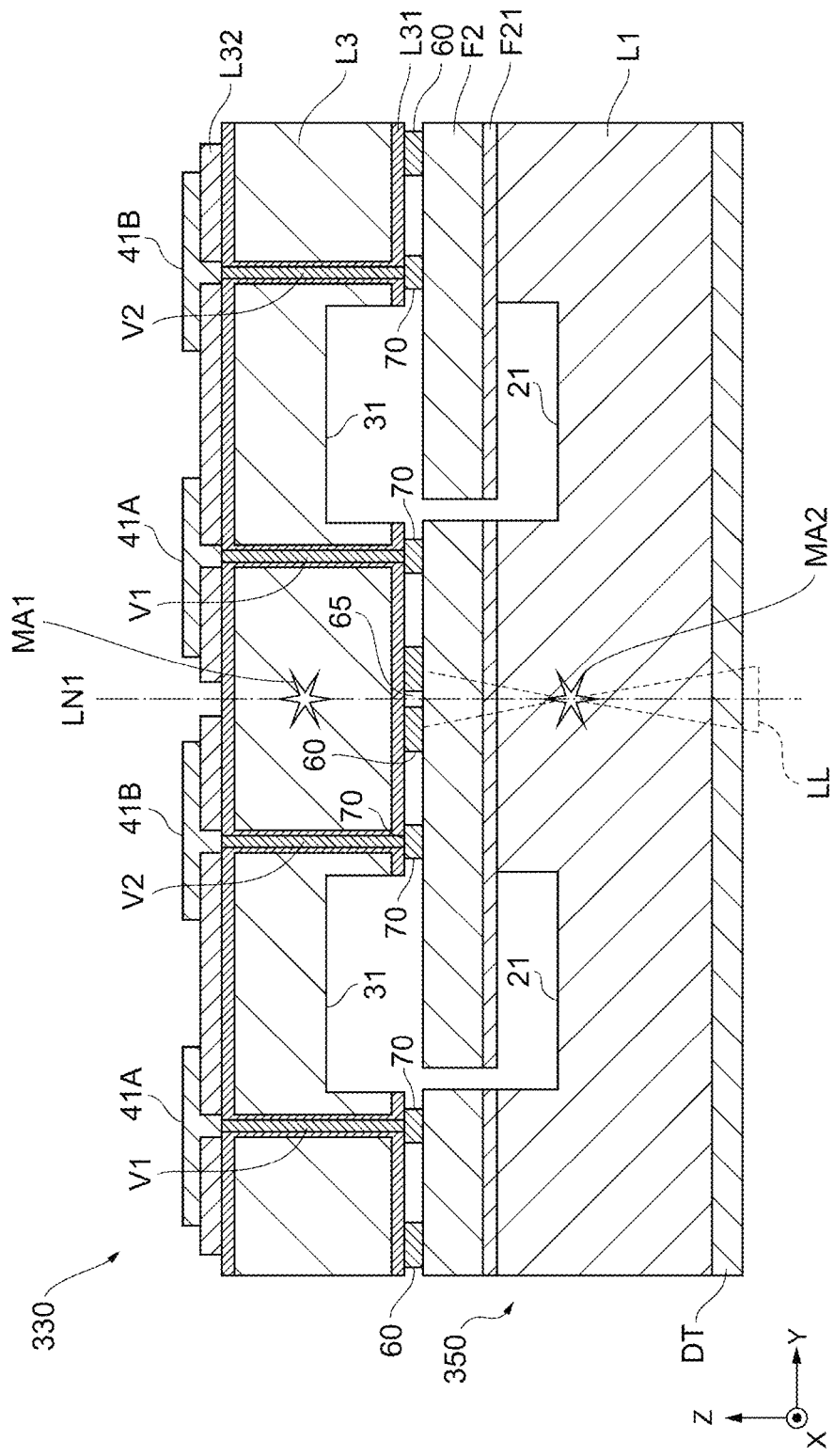
FIG. 7 is a sectional view illustrating a step depicted in FIG. 1.

First, a MEMS device manufacturing method according to a first exemplary embodiment of the present invention will be described while referring to FIGS. 1 to 8. FIG. 1 is a flowchart illustrating a method of manufacturing a resonance device 1 according to the first exemplary embodiment. FIG. 2 is a sectional view illustrating a step S301 depicted in FIG. 1. FIG. 3 is a sectional view illustrating a step S302 depicted in FIG. 1. FIG. 4 is a sectional view illustrating a step S303 depicted in FIG. 1. FIG. 5 is a plan view illustrating a first substrate 330 illustrated in FIG. 4. FIG. 6 is a sectional view illustrating a step S305 depicted in FIG. 1. FIG. 7 is a sectional view illustrating a step S306 depicted in FIG. 1.

Figure 8:
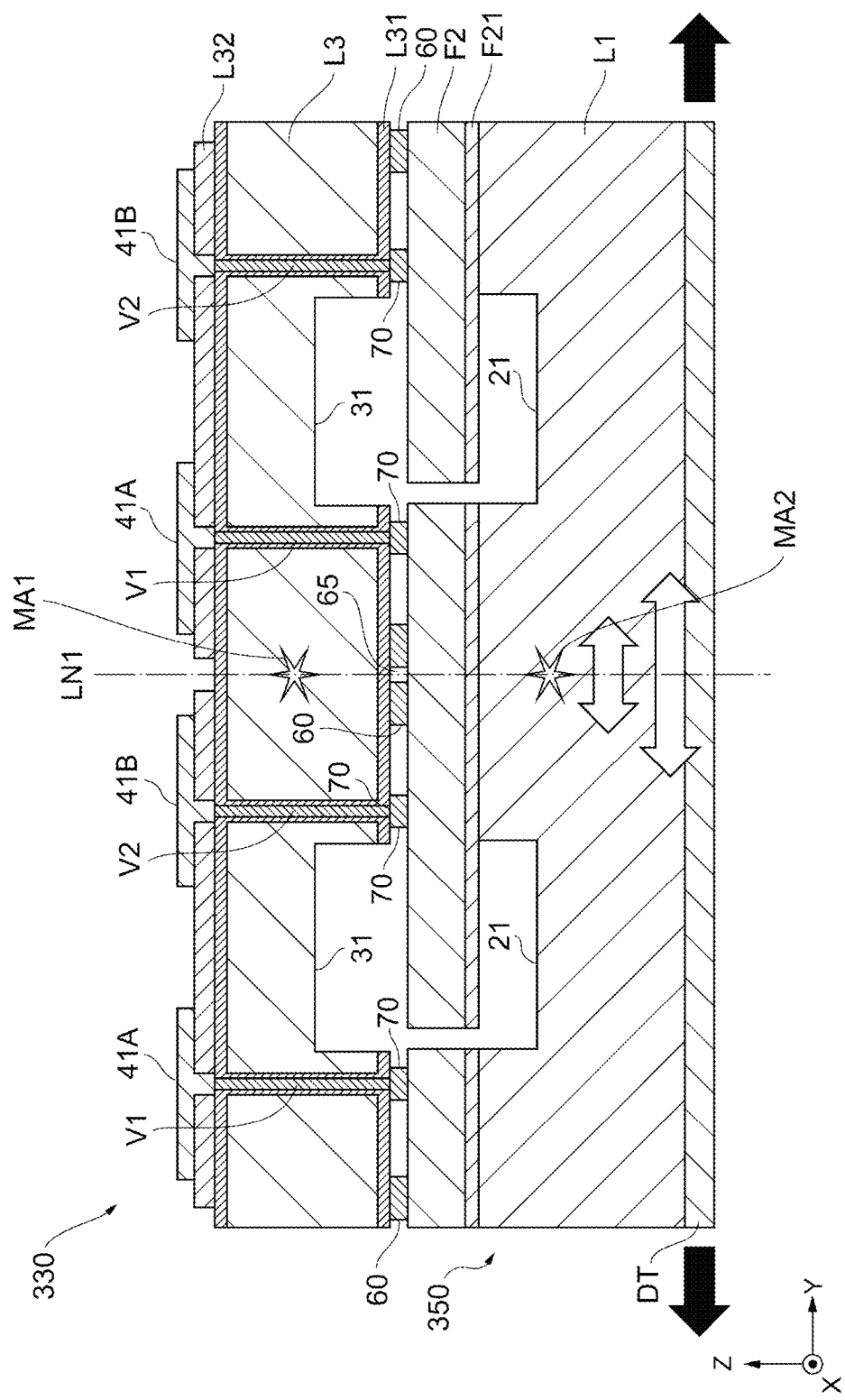
FIG. 8 is a sectional view illustrating a step depicted in FIG. 1.

Moreover, FIG. 8 is a sectional view illustrating a step S307 depicted in FIG. 1. In FIGS. 2 to 8, for the sake of convenience, some of a plurality of resonance devices 1 produced by the manufacturing method are illustrated and will be described.

In the following description, a resonance device 1 is generally described as including a bottom cover 20, a resonator 10 (hereafter, the lower lid 20 and the resonator 10 are also collectively referred to as a "MEMS substrate 50"), and a top cover 30 as an example of a MEMS device. However, it is noted that the first exemplary embodiment is not limited to the resonance device 1.

In addition, in the following description, a positive Z axis direction side is referred to as the "top" (or "front") and a negative Z axis direction side is referred to as the "bottom" (or "rear").

As illustrated in FIG. 1, the first substrate 330, which corresponds to the top cover 30 of the resonance device 1, is prepared (S301).

In an exemplary aspect, the first substrate 330 is formed using a silicon (Si) substrate (hereafter, referred to as a "Si substrate"). Specifically, as illustrated in FIG. 2, recesses 31 are formed in the rear surface of the first substrate 330. The first substrate 330 is formed of a silicon (Si) wafer (hereafter, "Si wafer") L3 having a prescribed thickness. A front surface and a rear surface (surface that will face a resonator 10) of the first substrate 330 and side surfaces of through electrodes V1 and V2 in the first substrate 330 are covered by a silicon oxide film L31. The silicon oxide film L31 is formed on the surfaces of the Si wafer L3 by oxidizing the surfaces of the Si wafer L3 or performing chemical vapor deposition (CVD) on the surfaces of the Si wafer L3, for example.

In addition, a plurality of electrode pads 41A and 41B are formed on the top surface of the first substrate 330. Specifically, a resin film L32 is stacked on the silicon oxide film L31 and the plurality of electrode pads 41A and 41B are formed on the silicon oxide film L31. The electrode pads 41A and 41B are formed using a metal such as gold (Au) or aluminum (Al), for example.

In addition, the electrode pads 41A are formed so as to contact the through electrodes V1. In an exemplary aspect, portions of the resin film L32 are removed by performing etching or the like and the electrode pads 41A are formed on the exposed through electrodes V1 and the resin film L32. Similarly, the electrode pads 41B are formed so as to contact the through electrodes V2. Portions of the resin film L32 are removed by performing etching or the like and the electrode pads 41B are formed on the exposed through electrodes V2 and the resin film L32.

Furthermore, the through electrodes V1 and V2 are formed by filling through holes formed in the first substrate 330 with an electrically conductive material. The filled electrically conductive material is, for example, impurity-doped polycrystalline silicon (Poly-Si), copper (Cu), gold (Au), or impurity-doped monocrystalline silicon.

Returning to FIG. 1, next, a second substrate 350, which corresponds to the MEMS substrate 50 (resonator 10 and bottom cover 20) of the resonance device 1, is prepared (S302).

The second substrate 350 is formed by bonding Si substrates to each other. The second substrate 350 may be formed using SOI substrates in an exemplary aspect. As illustrated in FIG. 3, the second substrate 350 includes a Si wafer L1, a Si substrate F2, and a silicon oxide (for example, $SiO_2$) layer F21.

Recesses 21 are formed in a surface (top surface in FIG. 3) of the Si wafer L1 that faces the Si substrate F2. In an exemplary aspect, the thickness of the Si wafer L1 is, for example, around 150 μm and the depth of the recesses 21 is, for example, around 50 μm. In addition, the Si wafer L1 is formed of non-degenerate silicon and the resistivity thereof is 16 mQ·cm or higher, for example.

The Si substrate F2 is formed using a degenerate n-type silicon (Si) semiconductor having a thickness of around 6 μm, for example, and can contain phosphorus (P), arsenic (As), antimony (Sb), and the like as n-type dopants. The resistance of the degenerate silicon (Si) used in the Si substrate F2 is, for example, less than 16 mQ·cm and more preferably is 1.2 mQ·cm or less. In addition, the silicon oxide (for example, $SiO_2$) layer F21 is formed on the bottom surface of the Si substrate F2 as an example of a temperature characteristic correcting layer. This enables the temperature characteristics to be improved. Note that the silicon oxide layer F21 may instead be formed on the top surface of the Si substrate F2 or may be formed on both the top surface and the bottom surface of the Si substrate F2.

Bonding portions 60 are formed on the top surface of the Si substrate F2, i.e., on the top surface of the second substrate 350 along a dividing line LN1. It is also noted that the top surface of the second substrate 350 faces the bottom surface of the first substrate 330 and corresponds to an example of a "first main surface" of the present disclosure. The bonding portions 60 are formed using an alloy of aluminum (Al) and germanium (Ge), for example. The bonding portions 60 may be formed of a gold (Au) film and a tin (Sn) film, or may be formed of a combination such as gold (Au) and silicon (Si), gold (Au) and gold (Au), or copper (Cu) and tin (Sn). In order to improve adhesion, the bonding portions 60 may include each include a thin layer of titanium (Ti), titanium nitride (TiN), tantalum nitride (TaN), or the like sandwiched between the stacked layers.

The bonding portions 60 include openings 65 formed along parts of the dividing line LN1. The openings 65 are formed by removing parts of the bonding portions 60 by performing etching or the like after forming bonding portions 60 with no openings.

Connection wiring lines 70 are formed on the top surface of the Si substrate F2 in addition to bonding portions 60. The connection wiring lines 70 are electrically connected to resonators 10, which are not illustrated. The connection wiring lines 70 are, for example, formed using a metal such as aluminum (Al), gold (Au), tin (Sn), or the like. The manufacturing process can be simplified by using the same metal for the material of the connection wiring lines 70 as for the bonding portions 60.

In this embodiment, an example has been described in which the bonding portions 60 and the connection wiring lines 70 are formed on the top surface of the second substrate 350, but it is noted that the exemplary aspect is not limited to this configuration. For example, at least either of the bonding portions 60 and the connection wiring lines 70 may be formed on the bottom surface of the first substrate 330 illustrated in FIG. 2. Note that the bottom surface of the first substrate 330 faces the top surface of the second substrate 350 and corresponds to an example of a "second main surface" of the present disclosure. In addition, in the case where the bonding portions 60 are formed of a plurality of materials, one of the materials of each bonding portion 60, for example, germanium (Ge), may be formed on the bottom surface of the first substrate 330 and the remaining material of each bonding portion 60, for example, aluminum (Al), may be formed on the top surface of the second substrate 350. Similarly, in the case where the connection wiring lines 70 are formed of a plurality of materials, one material of each connection wiring line 70 may be formed on the bottom surface the first substrate 330 and the remaining material of each connection wiring line 70 may be formed on the top surface of the second substrate 350.

Returning to FIG. 1, next, the bottom surface of the first substrate 330 and the top surface of the second substrate 350 are bonded to each other by the bonding portions 60 (S303).

Specifically, the bottom surface of the first substrate 330 and the top surface of the second substrate 350 are eutectically bonded to each other by the bonding portions 60. As illustrated in FIG. 4, the first substrate 330 and the second substrate 350 are positionally aligned with each other so that the through electrodes V1 and V2 of the first substrate 330 and the connection wiring lines 70 of the second substrate 350 contact each other. After carrying out the positional alignment, the first substrate 330 and the second substrate 350 are sandwiched in a heater or the like and a heating process is performed in order eutectically bond the substrates together. In an exemplary aspect, the temperature used in the heating process to create the eutectic bond is greater than or equal to the confocal temperature, for example, 424° C., and the heating time is around 10 to 20 minutes, for example. During heating, the first substrate 330 and the second substrate 350 are subjected to pressing with a pressure of, for example, around 5 to 25 MPa. Thus, the bonding portions 60 eutectically bond the bottom surface of the first substrate 330 and the top surface of the second substrate 350 to each other.

As illustrated in FIG. 5, each bonding portion 60 is formed in a substantially rectangular ring shape in the XY plane. The short sides of the bonding portions 60 extend along the dividing line LN1, which is parallel to an X axis, and the long sides of the bonding portions 60 extend along a dividing line LN2, which is parallel to a Y axis. A short side of each bonding portion 60 arranged on the positive Y axis direction side and a short side of each bonding portion 60 arranged on the negative Y axis direction side are spaced apart from each other with the dividing line LN1 interposed therebetween. Similarly, the long side of each bonding portion 60 arranged on the positive X axis direction side and the long side of each bonding portion 60 arranged on the negative X axis direction side are spaced apart from each other with the dividing line LN2 interposed therebetween. Furthermore, each bonding portion 60 has a runner that extends from a corner of the bonding portion 60 and is connected to a corner of another opposite bonding portion 60. Moreover, the runners and the gaps sandwiching the dividing lines LN1 and LN2 therebetween form the openings 65 of the bonding portions 60.

In an exemplary aspect, the width of the dividing lines LN1 and LN2 at the top surface of the first substrate 330 is, for example, 5 to 20 μm. This configuration enables the resonance devices 1 to be reduced in size and the number of obtained resonance devices 1 to be increased when the first substrate 330 and the second substrate 350 are divided along the dividing lines LN1 and LN2 to form individual resonance devices 1 (chips).

On the other hand, a width AW of the narrowest part of the width of each opening 65 at the top surface of the second substrate 350 is less than or equal to 20 μm, for example.

The electrode pads 41A to 41D are formed above the corners of the bonding portions 60. The electrode pads 41A to 41D each have a rectangular shape that extends in the Y axis direction in a plan view of the top surface of the first substrate 330. In addition, the electrode pads 41A to 41D are arranged with the dividing lines LN1 and LN2 interposed therebetween. In other words, an electrode pad 41A and an electrode pad 41B are arranged with the dividing line LN1 interposed therebetween and an electrode pad 41C and an electrode pad 41D are arranged with the dividing line LN1 interposed therebetween. In addition, an electrode pad 41A and an electrode pad 41C are arranged with the dividing line LN2 interposed therebetween and an electrode pad 41B and an electrode pad 41D are arranged with the dividing line LN2 interposed therebetween. According to the present disclosure, the electrode pads 41A to 41D correspond to an example of "a device part" and the top surface of the first substrate 330 corresponds to an example of a "first main surface".

A distance PD of the electrode pads 41A to 41D from the dividing lines LN1 and LN2 on the top surface of the first substrate 330 is larger than ½ the width AW of each opening 65. In other words, for example, the distance PD of the electrode pads 41A to 41D is larger than 10 μm when the width AW of the openings 65 is 20 μm.

Furthermore, the distance PD of the electrode pads 41A to 41D from the dividing lines LN1 and LN2 on the top surface of the first substrate 330 is greater than or equal to ⅙ of the thickness (i.e., the length in Z axis direction) of the first substrate 330. In other words, for example, the distance PD of the electrode pads 41A to 41D is greater than or equal to 50 μm when the thickness of the first substrate 330 is 150 μm.

Returning to FIG. 1, next, dicing tape DT is stuck to the bottom surface of the second substrate 350 (S304). The dicing tape DT is formed by applying an adhesive to a base material such as polyvinyl chloride (PVC), polyethylene terephthalate (PET), or polyolefin (PO). Note that the bottom surface of the second substrate 350 corresponds to an example of a "second main surface" of the present disclosure.

In this embodiment, as a method of dividing the first substrate 330 and the second substrate 350, dicing is performing using a stealth dicing technique, which allows the width of the dividing lines LN1 and LN2 to be made relatively small (narrow). In the stealth dicing technique, modified regions (modified layers) are formed inside the first substrate 330 and the second substrate 350, which are the objects that are to be divided, and the first substrate 330 and the second substrate 350 are divided with these modified regions serving as starting points.

Next, laser light LL is radiated from the top surface side of the first substrate 330 so that modified regions MA1 are formed inside the first substrate 330 along the dividing lines LN1 and LN2 (S305).

As illustrated in FIG. 6, the laser light LL is radiated so as to be focused (condensed) at a prescribed position in the thickness direction of the first substrate 330 (i.e., in a direction parallel to Z axis). The laser light LL is able to pass through the first substrate 330. In the case where the first substrate 330 is a Si substrate, for example, the wavelength of the laser light LL is around 1000 to 2000 nm. The radiated laser light LL is partially absorbed inside the first substrate 330 and the modified region MA1 is formed around the focal point position.

Then, the modified regions MA1 can be formed along the dividing line LN1 inside the first substrate 330 by moving either the laser light LL or the first substrate 330 in a direction parallel to the X axis direction along the dividing line LN1. Similarly, the modified regions MA1 can be formed along the dividing line LN2 inside the first substrate 330 by moving either the laser light LL or the first substrate 330 in a direction parallel to the Y axis direction along the dividing line LN2.

As described above, the distance PD of the electrode pads 41A to 41D from the dividing lines LN1 and LN2 on the top surface of the first substrate 330 is greater than or equal to ⅙ of the thickness (i.e., in length in Z axis direction) of the first substrate 330. This configuration prevents the electrode pads 41A to 41D from interfering with the laser light LL radiated along the dividing lines LN1 and LN2 from the top surface side of the first substrate 330.

The modified regions MA1 contain fissures (cracks), which are not illustrated, in the thickness direction (e.g., in the direction parallel to the Z axis) of the first substrate 330. These fissures extend toward the top surface and the bottom surface of the first substrate 330 when a stress is applied. Therefore, the first substrate 330 can be divided along the dividing lines LN1 and LN2 by applying stress to the modified regions MA1 formed inside the first substrate 330.

The laser light LL that is not absorbed inside the first substrate 330 attempts to pass through the first substrate 330 so as to be incident on the top surface of the second substrate 350. This laser light LL is partially blocked by the bonding portions 60 formed along the dividing lines LN1 and LN2. Moreover, it is possible to reduce the amount of laser light LL passing through the openings 65 of the bonding portions 60 by making the width AW of openings 65 sufficiently small with respect to the wavelength of the laser light LL.

It is generally noted that an example is illustrated in FIG. 6 in which a modified region MA1 is formed in one place inside the first substrate 330, but the present invention is not limited to this example. The number of modified regions MA1 is to be changed in accordance with the thickness of the first substrate 330. Therefore, a plurality of modified regions may be formed in the thickness direction (i.e., in the direction parallel to the Z axis) of the first substrate 330 by radiating laser light beams having different focal positions, for example.

Returning to FIG. 1, next, laser light LL is radiated from the bottom surface side of the second substrate 350 so that modified regions MA2 are formed inside the second substrate 350 along the dividing lines LN1 and LN2 (S306).

As illustrated in FIG. 7, the laser light LL is radiated so as to be focused (condensed) at a prescribed position in the thickness direction of the second substrate 350 (direction parallel to Z axis). The laser light LL is also able to pass through the second substrate 350. In the case where the second substrate 350 is a Si substrate, for example, the wavelength of the laser light LL is around 1000 nm (1 μm) to 2000 nm (2 μm). The radiated laser light LL is partially absorbed inside the second substrate 350 and the modified region MA2 is formed around the focal point position.

Then, the modified regions MA2 can be formed along the dividing lines LN1 inside the second substrate 350 by moving either the laser light LL or the second substrate 350 in a direction parallel to the X axis direction along the dividing line LN1. Similarly, the modified regions MA2 can be formed along the dividing line LN2 inside the second substrate 350 by moving either the laser light LL or the second substrate 350 in a direction parallel to the Y axis direction along the dividing line LN2.

The modified regions MA2 contain fissures (cracks), which are not illustrated, in the thickness direction (direction parallel to the Z axis) of the second substrate 350. These fissures extend toward the top surface and the bottom surface of the second substrate 350 when a stress is applied. Therefore, the second substrate 350 can be divided along the dividing lines LN1 and LN2 by applying stress to the modified regions MA2 formed inside the second substrate 350.

The laser light LL that is not absorbed inside the second substrate 350 attempts to pass through the second substrate 350 and be incident on the bottom surface of the first substrate 330. This laser light LL is partially blocked by the bonding portions 60 formed along the dividing lines LN1 and LN2. It also is possible to reduce the amount of laser light LL passing through the openings 65 of the bonding portions 60 by making the width AW of openings 65 sufficiently small with respect to the wavelength of the laser light LL.

In the exemplary aspect, the amount of laser light LL that is not absorbed inside the second substrate 350 and is incident on the first substrate 330 is reduced by the bonding portions 60 formed along the dividing lines LN1 and LN2 blocking the laser light LL radiated from the bottom surface side of the second substrate 350. Therefore, the manufacturing method suppresses damage to device parts, such as the electrode pads 41A to 41D formed on the first substrate 330 caused by the laser light LL.

In addition, as described above, the distance PD of the electrode pads 41A to 41D from the dividing lines LN1 and LN2 at the top surface of the first substrate 330 is larger than ½ the width AW of the openings 65. As a result, since the electrode pads 41A to 41D are arranged outside the openings 65 with respect to the dividing lines LN1 and LN2, even if the laser light LL radiated along the dividing lines LN1 and LN2 from the bottom surface side of the second substrate 350 passes through the openings 65, the possibility of the laser light acting on the electrode pads 41A to 41D formed on the top surface of the first substrate 330 or on the resin film L32 formed therebelow can be reduced. Therefore, damage to the electrode pads 41A to 41D formed on the first substrate 330 caused by the laser light LL can further be suppressed.

Note that an example is illustrated in FIG. 7 in which a modified region MA2 is formed in one place inside the second substrate 350, but the present invention is not limited to this example. Instead, the number of modified regions MA2 is to be changed in accordance with the thickness of the second substrate 350. Therefore, a plurality of modified regions can be formed in the thickness direction (i.e., in the direction parallel to the Z axis) of the second substrate 350 by radiating laser light beams having different focal positions, for example.

Returning to FIG. 1, next, the first substrate 330 and the second substrate 350 are divided along the dividing lines LN1 and LN2 (S307).

Specifically, the dicing tape DT expands in directions parallel to the positive Y axis direction and the negative Y axis direction, as indicated by the black arrows in FIG. 8. This expansion of the dicing tape DT causes tensile stress to be generated at the bottom surface of the second substrate 350, as indicated by the white arrows in FIG. 8, and the tensile stress is transferred into the inside of the second substrate 350 and acts on the fissures in the modified regions MA2. As a result, the fissures expand and the second substrate 350 is divided. In addition, the further expansion of the dicing tape DT causes tensile stress to be generated at the bottom surface of the first substrate 330, and the tensile stress is transferred into the inside of the first substrate 330 and acts on the fissures in the modified regions MA1. As a result, the fissures expand and the first substrate 330 is divided.

The first substrate 330 and the second substrate 350 are divided into individual resonance devices 1 (chips), which each include the top cover 30 and the MEMS substrate 50 (i.e., the bottom cover 20 and resonator 10), by dividing the first substrate 330 and the second substrate 350 along the dividing lines LN1 and LN2 in this way.

Here, in the case where the bonding portions 60 do not include openings 65, the bonding portions 60 are formed so as to straddle (e.g., cross) the dividing lines LN1 and LN2. Therefore, when the first substrate 330 and the second substrate 350 are divided along the dividing lines LN1 and LN2, division defects may occur at the bonding portions 60. There is a risk of these division defects leading to manufacturing defects such as protrusions (e.g., burrs) in the individual resonance devices 1. Therefore, division defects that may occur when the first substrate 330 and the second substrate 350 are divided along the dividing lines LN1 and LN2 can be suppressed due to the bonding portions 60 having the openings 65 formed along parts of the dividing lines LN1 and LN2.

Furthermore, as described above, the width AW of the openings 65 at the top surface of the second substrate 350 is less than or equal to 20 μm. This configuration enables both blocking of the laser light LL and suppression of division defects to be realized.

Figure 9:
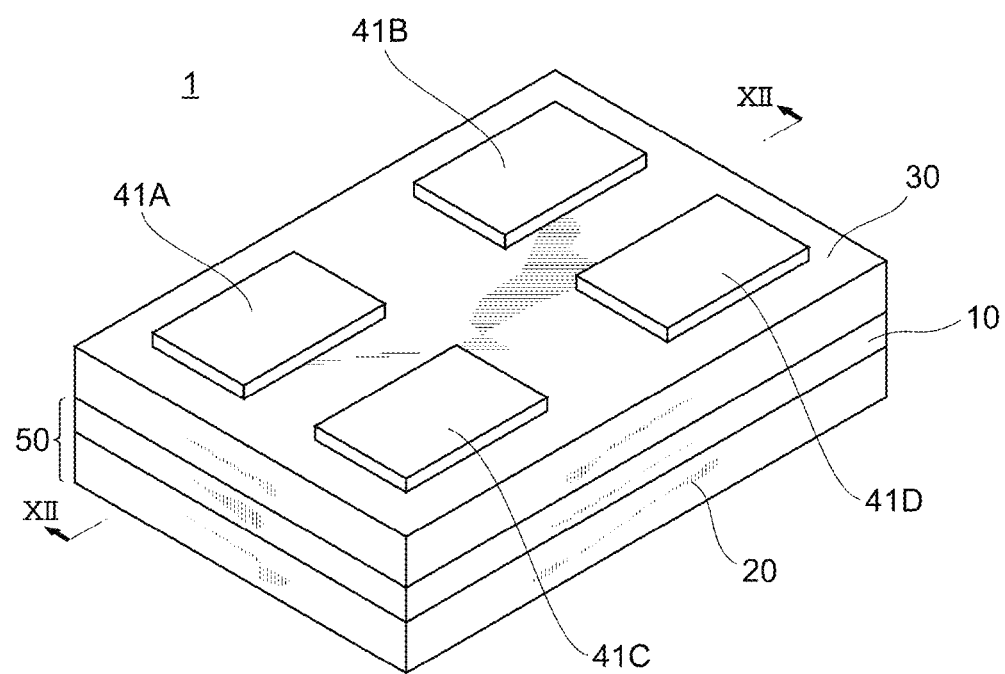
FIG. 9 is a perspective view schematically illustrating the exterior of the resonance device according to the first embodiment.
Figure 10:
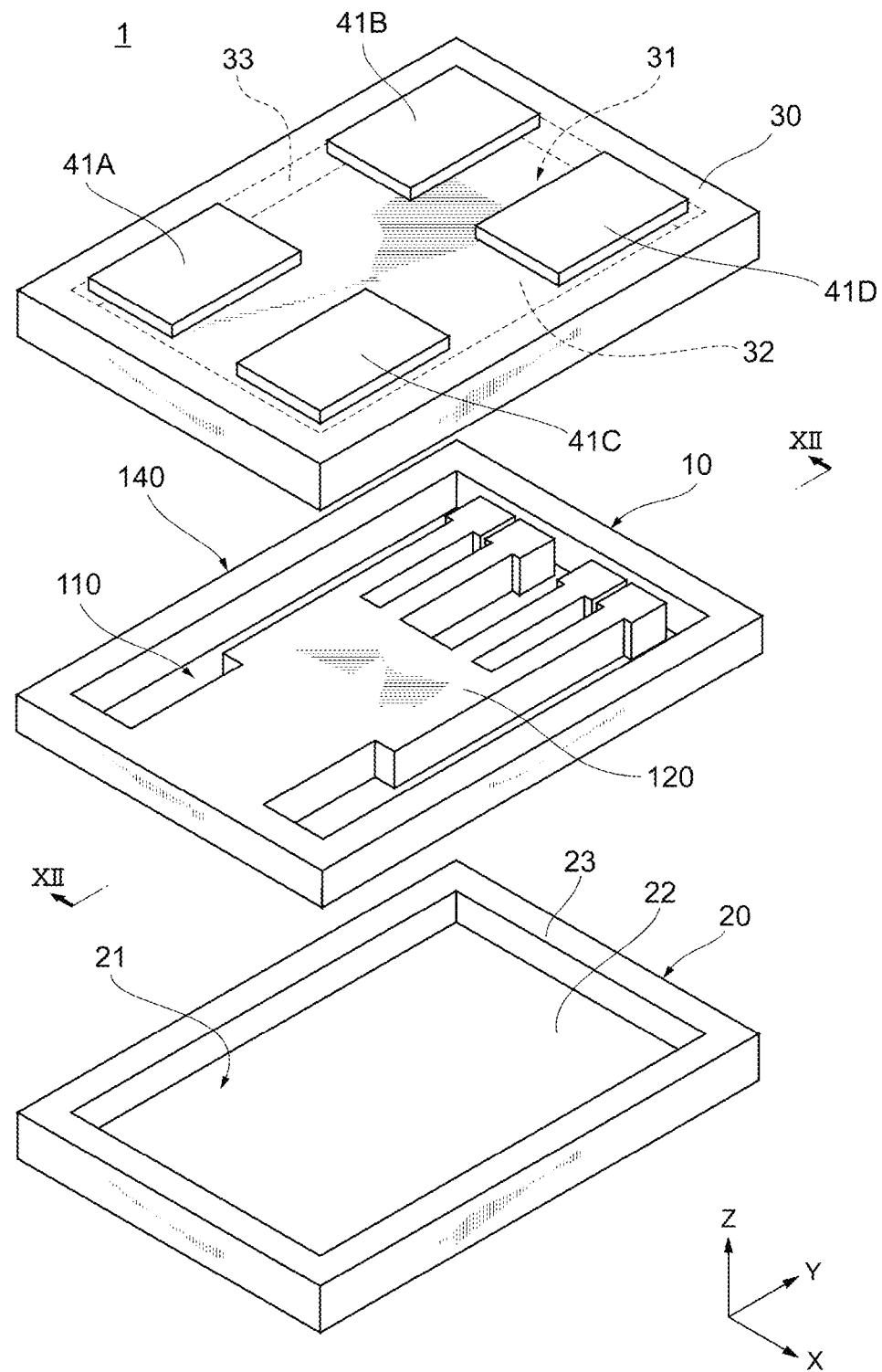
FIG. 10 is an exploded perspective view schematically illustrating the structure of the resonance device illustrated in FIG. 9.
Figure 11:
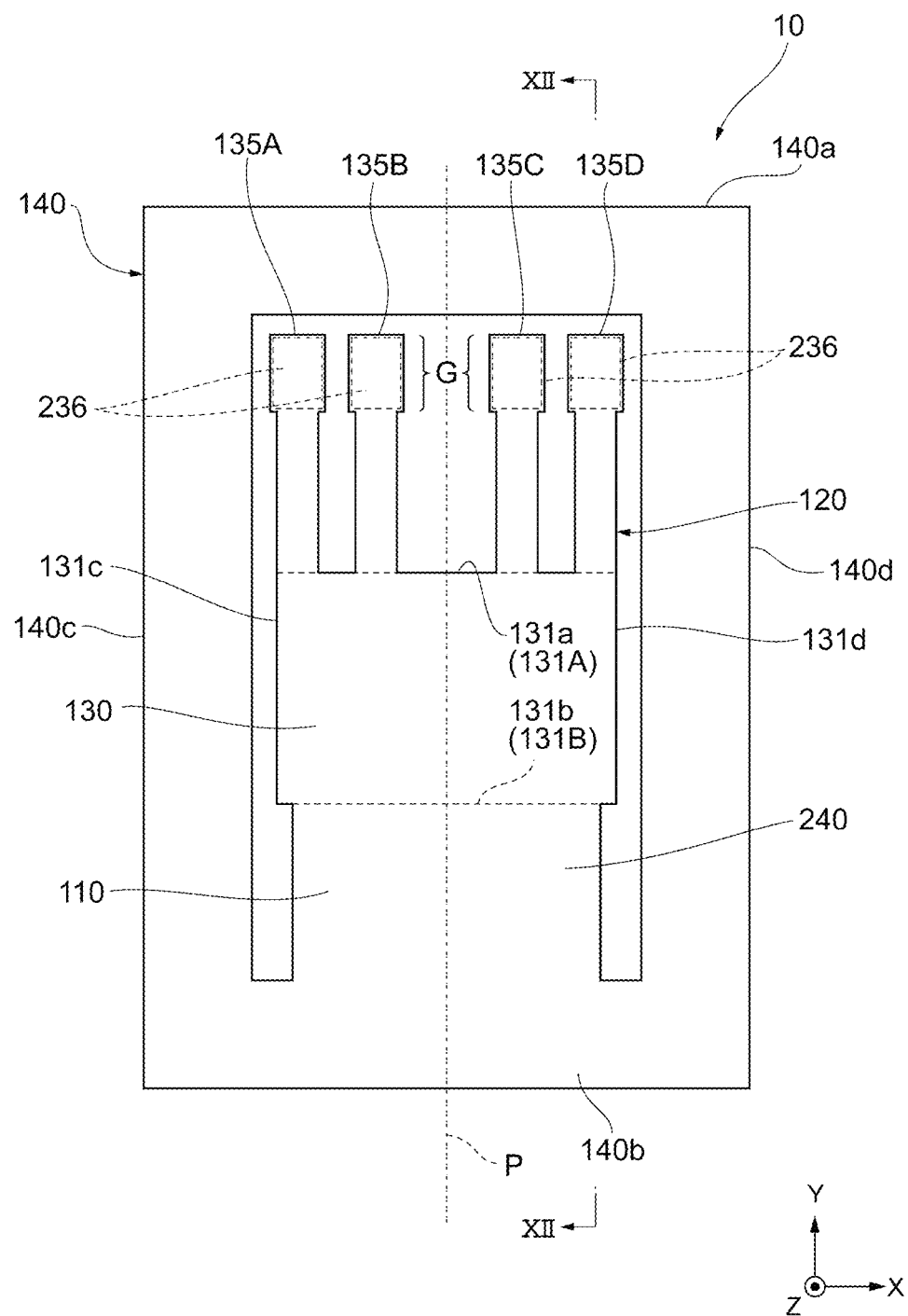
FIG. 11 is a plan view schematically illustrating the structure of a resonator illustrated in FIG. 10.
Figure 12:
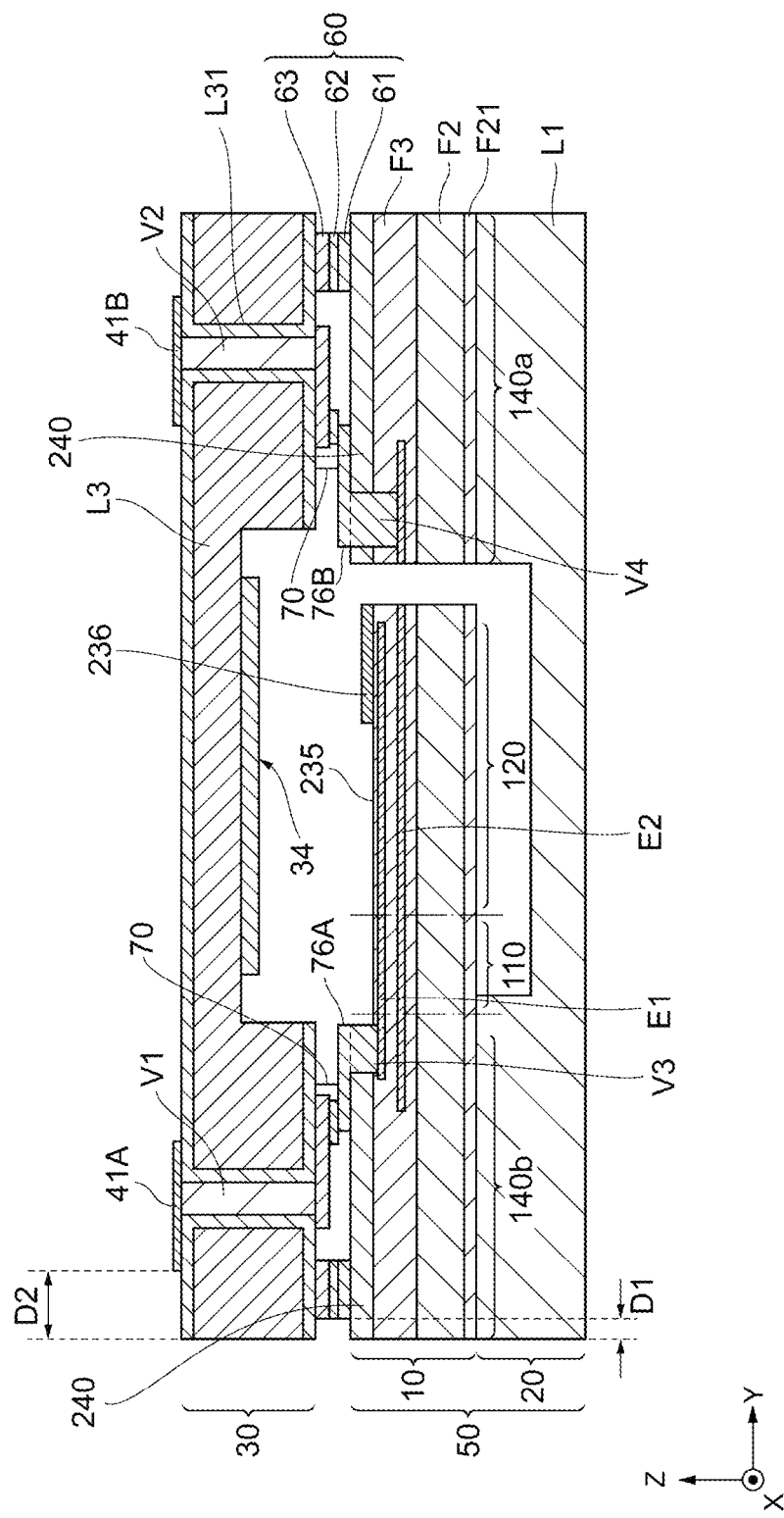
FIG. 12 is a sectional view schematically illustrating the configuration of a cross section of the resonance device illustrated in FIGS. 9 to 11 taken along the line XII-XII.

Next, the resonance device 1, which is manufactured using the MEMS device manufacturing method according to the first exemplary embodiment, will be described while referring to FIGS. 9 to 12. FIG. 9 is a perspective view schematically illustrating the exterior of the resonance device 1 according to the first exemplary embodiment. FIG. 10 is an exploded perspective view schematically illustrating the structure of the resonance device 1 illustrated in FIG. 9. FIG. 11 is a plan view schematically illustrating the structure of a resonator 10 illustrated in FIG. 10. FIG. 12 is a sectional view schematically illustrating the configuration of a cross section of the resonance device 1 illustrated in FIGS. 9 to 11 taken along the line XII-XII.

In the following description, the side of the resonance device 1 where the top cover 30 is provided is referred to as the "top" (or "front") and the side where the bottom cover 20 is provided is referred to as the "bottom" (or "rear").

The resonance device 1 includes the MEMS substrate 50 (i.e., bottom cover 20 and resonator 10) and the top cover 30. In other words, the resonance device 1 is formed by stacking the MEMS substrate 50, the above-described bonding portions 60, and the top cover 30 in this order.

The resonator 10 is a MEMS vibrator manufactured using a MEMS technology. The resonator 10 and the top cover 30 are bonded to each other by the bonding portions 60.

The top cover 30 extends in a flat plate shape along the XY plane and the recess 31, which has a flat rectangular parallelepiped shape is formed in the rear surface of the top cover 30. The recess 31 is surrounded by a side wall 33 and the recess 31 forms part of a vibration space, which is a space in which the resonator 10 vibrates. The top cover 30 may instead be configured as a flat plate without the recess 31.

The four electrode pads 41A, 41B, 41C, and 41D are provided on the front surface of the top cover 30. The electrode pads 41A, 41B, 41C, and 41D are electrically connected to the resonator 10.

As further shown, the bottom cover 20 includes a rectangular flat plate shaped bottom plate 22, which is provided along the XY plane, and a side wall 23, which extends in the Z axis direction from the periphery of the bottom plate 22, i.e., in the direction in which the bottom cover 20 and the resonator 10 are stacked. The recess 21, which is formed by the front surface of the bottom plate 22 and the inner surface of the side wall 23, is formed in the surface of the bottom cover 20 that faces the resonator 10. The recess 21 forms part of the vibration space of the resonator 10. The bottom cover 20 may instead be configured as a flat plate without the recess 21.

As illustrated in FIG. 11, the resonator 10 is a MEMS vibrator manufactured using MEMS technology and undergoes out-of-plane vibration in the XY plane in the Cartesian coordinate system in FIG. 11. It is noted that the resonator 10 does not have to be a resonator using an out-of-plane bending vibration mode. In alternative aspects, the resonator of the resonance device 1 may, for example, use a spreading vibration mode, a thickness longitudinal vibration mode, a Lamb wave vibration mode, an in-plane bending vibration mode, or a surface acoustic wave vibration mode. These vibrators are applied, for example, to timing devices, RF filters, duplexers, ultrasonic transducers, gyroscopic sensors, accelerometers, and so forth. Furthermore, the vibrators may also be used in piezoelectric mirrors having actuator functions, piezoelectric gyros, piezoelectric microphones having pressure sensor functions, ultrasonic vibration sensors, and so on. In addition, the vibrators may be applied to electrostatic MEMS elements, electromagnetic driving MEMS elements, and piezo-resistance MEMS elements.

The resonator 10 includes a vibrating portion 120, a holding portion 140 (e.g., a frame), and a holding arm 110.

The holding portion 140 is formed in a rectangular frame shape so as to surround the outside of the vibrating portion 120 along the XY plane. For example, the holding portion 140 is integrally formed from a prism-shaped frame. Note that it is sufficient that the holding portion 140 be provided along at least part of the periphery of the vibrating portion 120 and the holding portion 140 is not limited to having a frame-like shape.

The holding arm 110 is provided on the inner side of the holding portion 140 and connects the vibrating portion 120 and the holding portion 140 to each other.

The vibrating portion 120 is provided on the inner side of the holding portion 140 and a space is formed between the vibrating portion 120 and the holding portion 140 with a predetermined spacing. In the example illustrated in FIG. 11, the vibrating portion 120 includes a base portion 130 (or simply a base) and four vibrating arms 135A to 135D (hereafter, also collectively referred to as "vibrating arms 135"). Note that the number of vibrating arms is not limited to four and an arbitrary number of vibrating arms such as one or more may be provided. In this embodiment, the vibrating arms 135A to 135D and the base portion 130 are formed so as to be integrated with each other.

In a plan view, the base portion 130 has long sides 131a and 131b that extend in the X axis direction and short sides 131c and 131d that extend in the Y axis direction. The long side 131a is one side of the surface of the front end of the base portion 130 (hereafter, also referred to as "front end 131A") and the long side 131b is one side of the surface of the rear end of the base portion 130 (hereafter, referred to as "rear end 131B"). The front end 131A and the rear end 131B of the base portion 130 are provided so as to face each other.

The base portion 130 is connected to the vibrating arms 135 at the front end 131A and is connected to the holding arm 110, which is described later, at the rear end 131B. The base portion 130 has a substantially rectangular shape in plan view in the example illustrated in FIG. 11, but is not limited to this shape. It is sufficient that the base portion 130 be formed so as to substantially have planar symmetry with respect to a virtual plane P defined along a vertical bisector of the long side 131a. For example, the base portion 130 may have a trapezoidal shape in which the long side 131b is shorter than the long side 131a or the base portion 130 may have a semi-circular shape in which the long side 131a is the diameter. Furthermore, the surfaces of the base portion 130 are not limited to being flat surfaces and may be curved surfaces. The virtual plane P is a plane that extends through the center, in the direction in which the vibrating arms 135 are arrayed, of the vibrating portion 120.

In the base portion 130, a base portion length, which is the longest distance between the front end 131A and the rear end 131B in the direction from the front end 131A to the rear end 131B, is around 35 μm. Furthermore, a base portion width, which is the longest distance between side edges of the base portion 130 in a width direction perpendicular to the base portion length direction, is around 265 μm.

The vibrating arms 135 extend in the Y axis direction and have the same size as each other. The vibrating arms 135 are provided parallel to the Y axis direction between the base portion 130 and the holding portion 140 and first ends thereof are fixed ends that are connected to the front end 131A of the base portion 130 and second ends thereof are open ends. In addition, the vibrating arms 135 are provided parallel to each other with a prescribed interval therebetween in the X axis direction. The vibrating arms 135, for example, have a width of around 50 μm in the X axis direction and a length of around 465 μm in the Y axis direction.

In an exemplary aspect, part of each vibrating arm 135 extending around 150 μm from the open end is wider in the X axis direction than the other part of the vibrating arm 135. This wider part is called a weight portion G. Moreover, each weight portion G is, for example, 10 μm wider on each side in the X-axis direction than the other portion of the vibrating arm 135 and has a width of around 70 μm in the X-axis direction. The weight portions G are integrally formed using the same process as for the vibrating arms 135. As a result of forming the weight portions G, the vibrating arms 135 have a higher weight per unit length at the open ends thereof than at the fixed ends thereof. Therefore, the amplitude of the vibration in the vertical direction in each vibrating arm can be increased due to each of the vibrating arms 135 having the weight portion G at the open end thereof.

A protective film 235, which is described later, is formed so as to cover the entire front surface of the vibrating portion 120 (the surface facing the top cover 30). In addition, a frequency-adjusting film 236 is formed on the front surface of the protective film 235 on the tips, on the open-end side, of the vibrating arms 135A to 135D. The resonant frequency of the vibrating portion 120 can be adjusted using the protective film 235 and the frequency-adjusting film 236.

In this embodiment, substantially the entirety of the front surface of the resonator 10 (i.e., the surface on the side facing the top cover 30) is covered by the protective film 235. In addition, substantially the entire front surface of the protective film 235 is covered by a parasitic capacitance reducing film 240. However, it is sufficient that the protective film 235 cover at least the vibrating arms 135 and the protective film 235 is not limited to being formed so as to cover substantially the entire surface of the resonator 10.

As illustrated in FIG. 12, in the resonance device 1, the holding portion 140 of the resonator 10 is bonded to the top of the side wall 23 of the bottom cover 20 and furthermore, the holding portion 140 of the resonator 10 and the side wall 33 of the top cover 30 are bonded to each other. Thus, the resonator 10 is held between the bottom cover 20 and the top cover 30 and a vibration space in which the vibrating arms 135 vibrate is formed by the bottom cover 20, the top cover 30, and the holding portion 140 of the resonator 10. In addition, the electrode pads 41A and 41B are formed on the top surface of the top cover 30 (surface on opposite side from surface facing resonator 10). The electrode pads 41A and 41B and the resonator 10 are electrically connected to each other by the through electrodes V1 and V2, the connection wiring lines 70, and contact electrodes 76A and 76B.

The top cover 30 is bonded to the holding portion 140 of the resonator 10 by the bonding portions 60 along the periphery (i.e., the side wall 33) thereof. The bottom surface, which faces the resonator 10, and the top surface of the top cover 30 and the side surfaces of the through electrodes V1 and V2 in the top cover 30 are covered by the silicon oxide film L31.

In addition, in the exemplary aspect a getter layer 34 is formed on the surface of the recess 31, which is on the side facing the resonator 10, of the top cover 30. The getter layer 34 is, for example, formed of titanium (Ti) and absorbs outgas generated in the vibration space. As a result of forming the getter layer 34 over substantially the entire surface of the recess 31, on the side facing the resonator 10, in the top cover 30 according to this embodiment, a fall in the degree of vacuum of the vibration space can be suppressed.

The through electrode V1 of the top cover 30 serves as a wiring line for electrically connecting the electrode pad 41A and the connection wiring line 70 to each other. The through electrode V2 of the top cover 30 serves as a wiring line for electrically connecting the electrode pad 41B and the connection wiring line 70 to each other.

The bottom plate 22 and the side wall 23 of the bottom cover 20 are integrally formed by the Si wafer L1. In addition, the bottom cover 20 is bonded to the holding portion 140 of the resonator 10 by the top surface of the side wall 23.

According to the exemplary aspect, the holding portion 140, the base portion 130, the vibrating arms 135, and the holding arm 110 of the resonator 10 are integrally formed with each other using the same process. In the resonator 10, a piezoelectric thin film F3 is formed on the Si substrate F2 so as to cover the Si substrate F2, and furthermore, a metal layer E2 is stacked on the piezoelectric thin film F3. In addition, the piezoelectric thin film F3 is stacked on the metal layer E2 so as to cover the metal layer E2 and a metal layer E1 is stacked on the piezoelectric thin film F3. The protective film 235 is stacked on the metal layer E1 so as to cover the metal layer E1 and the parasitic capacitance reducing film 240 is stacked on the protective film 235.

The silicon oxide (for example, $SiO_2$) layer F21 is formed on the bottom surface of the Si substrate F2 as an example of a temperature characteristic correcting layer.

Moreover, the metal layers E1 and E2, for example, have a thickness of around 0.1 to 0.2 μm and are patterned into desired shapes using etching or the like after being deposited. Metals having a body-centered cubic crystal structure are used for the metal layers E1 and E2. Specifically, the metal layers E1 and E2 are formed using molybdenum (Mo), tungsten (W), or the like.

The metal layer E1 is, for example, formed on the vibrating portion 120 so as to serve as an upper electrode. In addition, the metal layer E1 is formed on the holding arm 110 and the holding portion 140 so as to serve as a wiring line for connecting the upper electrode to an AC power source provided outside the resonator 10.

On the other hand, the metal layer E2 is formed on the vibrating portion 120 so as to serve as a lower electrode. Furthermore, the metal layer E2 is formed on the holding arm 110 and the holding portion 140 so as to serve as a wiring line for connecting the lower electrode to a circuit provided outside the resonator 10.

The piezoelectric thin film F3 is a thin film composed of a piezoelectric material that converts voltages applied thereto into vibrations. The piezoelectric film F3 is formed of a material having a wurtzite-type hexagonal crystal structure and for example can have a nitride or an oxide as a main constituent such as aluminum nitride (AlN), scandium aluminum nitride (ScAlN), zinc oxide (ZnO), gallium nitride (GaN), or indium nitride (InN). Scandium aluminum nitride is a substance obtained by replacing some of the aluminum in aluminum nitride with scandium, and instead of scandium, the aluminum may be replaced with two elements such as magnesium (Mg) and niobium (Nb) or magnesium (Mg) and zirconium (Zr). In addition, the piezoelectric thin film F3 has, for example, a thickness of 1 μm, but a thickness of around 0.2 to 2 μm may be used.

In operation, the piezoelectric thin film F3 expands and contracts in in-plane directions in the XY plane, i.e., in the Y axis direction, in accordance with an electric field applied to the piezoelectric thin film F3 by the metal layers E1 and E2. The free ends of the vibrating arms 135 are displaced toward the inner surfaces of the bottom cover 20 and the top cover 30 by the expansion and contraction of the piezoelectric thin film F3 and the vibrating arms 135 vibrate in an out-of-plane bending vibration mode.

In this embodiment, the phase of the electric field applied to the outer vibrating arms 135A and 135D and the phase of the electric field applied to the inner vibrating arms 135B and 135C are set so as to be opposite phases. This causes the outer vibrating arms 135A and 135D and the inner vibrating arms 135B and 135C to be displaced in opposite directions from each other. For example, when the free ends of the outer vibrating arms 135A and 135D are displaced toward the inner surface of the top cover 30, the free ends of the inner vibrating arms 135B and 135C are displaced toward the inner surface of the bottom cover 20.

Moreover, the protective film 235 prevents oxidation of the metal layer E2, which is an upper electrode used for inducing piezoelectric vibrations. The protective film 235 is preferably formed of a material having a higher speed of mass reduction by etching than the frequency-adjusting film 236. The speed of mass reduction is expressed by the etching speed, i.e., the product of the thickness removed per unit time and the density. The protective film 235 is, for example, formed of a piezoelectric film composed of aluminum nitride (AlN), scandium aluminum nitride (ScAlN), zinc oxide (ZnO), gallium nitride (GaN), indium nitride (InN), or the like or an insulating film composed of silicon nitride (SiN), silicon oxide ($SiO_2$), alumina oxide ($Al_2O_3$), or the like. The thickness of the protective film 235 is, for example, around 0.2 μm.

The frequency-adjusting film 236 is formed only on prescribed regions by performing etching or the like after forming the frequency-adjusting film 236 over substantially the entire surface of the vibrating portion 120. The frequency-adjusting film 236 is formed of a material having a faster speed of mass reduction by etching than the protective film 235. Specifically, the frequency-adjusting film 236 is formed of a metal such as molybdenum (Mo), tungsten (W), gold (Au), platinum (Pt), nickel (Ni), or titanium (Ti).

It is noted that so long as the relationship between the mass reduction speeds of the protective film 235 and the frequency-adjusting film 236 is as described above, the relationship between the magnitudes of the etching speeds may be arbitrary.

The parasitic capacitance reducing film 240 is formed of tetraethyl orthosilicate (TEOS). The thickness of the parasitic capacitance reducing film 240 is around 1 μm. As well as reducing parasitic capacitances at lead-out wiring parts, the parasitic capacitance reducing film 240 functions as an insulating layer for when wiring lines of different potentials cross each other and functions as a stand off film for increasing the vibration space.

The bonding portions 60 bond the MEMS substrate 50 and the top cover 30 to each other so as to seal the vibration space of the resonator 10. This configuration enables the vibration space to be hermetically sealed and a vacuum state to be maintained.

In the exemplary aspect, the material of the bonding portions 60 is a metal constructed for blocking the laser light LL that is able to pass through the top cover 30 and the MEMS substrate 50 (bottom cover 20 and resonator 10). As a result, the laser light LL radiated from the bottom surface side of the MEMS substrate 50 (bottom cover 20 and resonator 10) when dividing the substrates can be blocked by the bonding portions 60 and the amount of light incident on the top cover 30 can be reduced. Therefore, damage to device parts, such as the electrode pads 41A to 41D formed on the top cover 30, can be suppressed that would otherwise be caused by the laser light LL.

In the example illustrated in FIG. 12, an aluminum (Al) layer 61, a germanium (Ge) layer 62, and an aluminum (Al) layer 63 are illustrated as separate layers, but in reality, the boundaries between these layers are eutectic bonds.

The bonding portions 60 are arranged at a first distance D1 from the outer edge on the top surface of the MEMS substrate 50 (bottom cover 20 and resonator 10). This configuration suppresses manufacturing defects from occurring in the resonance device 1 such as protrusions (burrs) accompanying division defects that may occur when the bonding portions 60 are arranged without the first distance D1.

The first distance D1 of the bonding portions 60 is, for example, less than or equal to 20 μm. This configuration enables both blocking of the laser light LL and suppressing of manufacturing defects in the resonance device 1 to be realized.

The electrode pads 41A to 41D are arranged at a second distance D2, which is larger than the first distance D1, from the outer edge on the top surface of the top cover 30 (first distance D1<second distance D2). As a result, since the electrode pads 41A to 41D are disposed further toward the inside than the bonding portions 60 with respect to the outer edge, the possibility of the laser light LL radiated from the bottom surface side of the MEMS substrate 50 (bottom cover 20 and resonator 10) acting on the electrode pads 41A to 41D when dividing the substrates can be reduced. Therefore, damage to the electrode pads 41A to 41D formed on the top cover 30 can further be suppressed that would otherwise be caused by the laser light LL.

The second distance D2 of the electrode pads 41A to 41D is, for example, greater than or equal to ⅙ the thickness (i.e., length in Z axis direction) of the top cover 30. This configuration makes to possible to prevent the electrode pads 41A to 41D from interfering with the laser light LL radiated from the top surface side of the top cover 30 when dividing the substrates.

The connection wiring line 70 is electrically connected to the electrode pad 41A via the through electrode V1 and is electrically connected to the contact electrode 76A. In addition, the connection wiring line 70 is electrically connected to the electrode pad 41B via the through electrode V2 and is electrically connected to the contact electrode 76B.

The contact electrode 76A is formed so as to contact the metal layer E1 of the resonator 10 and electrically connects the connection wiring line 70 and the resonator 10 to each other. The contact electrode 76B is formed so as to contact the metal layer E2 of the resonator 10 and electrically connects the connection wiring line 70 and the resonator 10 to each other. Specifically, when connecting the contact electrode 76A and the metal layer E1 to each other, a portion of each of the piezoelectric film F3, the protective film 235, and the parasitic capacitance reducing film 240 stacked on the metal layer E1 is removed in order to expose the metal layer E1 and a via V3 is formed. The inside of the formed via V3 is filled with the same material as the contact electrode 76A and the metal layer E1 and the contact electrode 76A are connected to each other. Similarly, when connecting the contact electrode 76B and the metal layer E2 to each other, portions of the piezoelectric film F3 and the parasitic capacitance reducing film 240 stacked on the metal layer E2 are removed in order to expose the metal layer E2 and a via V4 is formed. The inside of the formed via V4 is filled with the contact electrode 76B and the metal layer E2 and the contact electrode 76B are connected to each other. The contact electrodes 76A and 76B are, for example, formed of a metal such as aluminum (Al), gold (Au), or tin (Sn). It is preferable that the connection point between the metal layer E1 and the contact electrode 76A and the connection point between the metal layer E2 and the contact electrode 76B be located in a region outside the vibrating portion 120, and in this embodiment, these points are connected in the holding portion 140.

Second Exemplary Embodiment

Next, a MEMS device manufacturing method and a MEMS device according to a second exemplary embodiment will be described while referring to FIGS. 13 to 16. Note that constituent elements that are identical or similar to those in the first embodiment are denoted by identical or similar reference symbols. Hereafter, the description will focus on points that are different from the first embodiment described above. In addition, the same operational effects resulting from the same configurations will not be repeatedly described.

Figure 13:
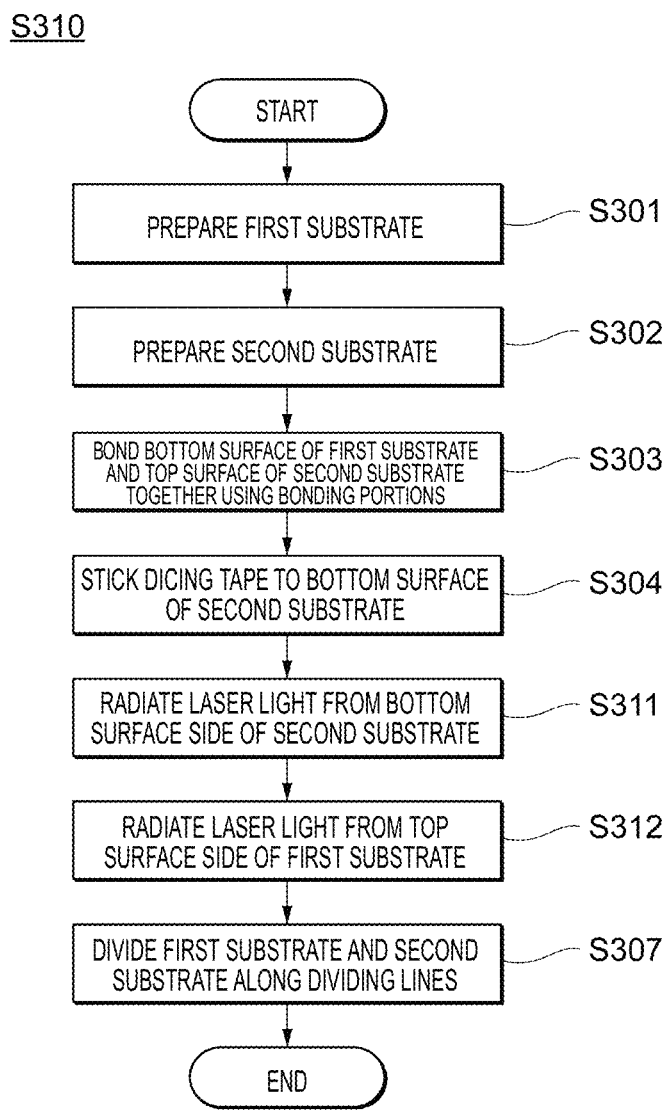
FIG. 13 is a flowchart illustrating a method of manufacturing a resonance device according to a second embodiment.
Figure 14:
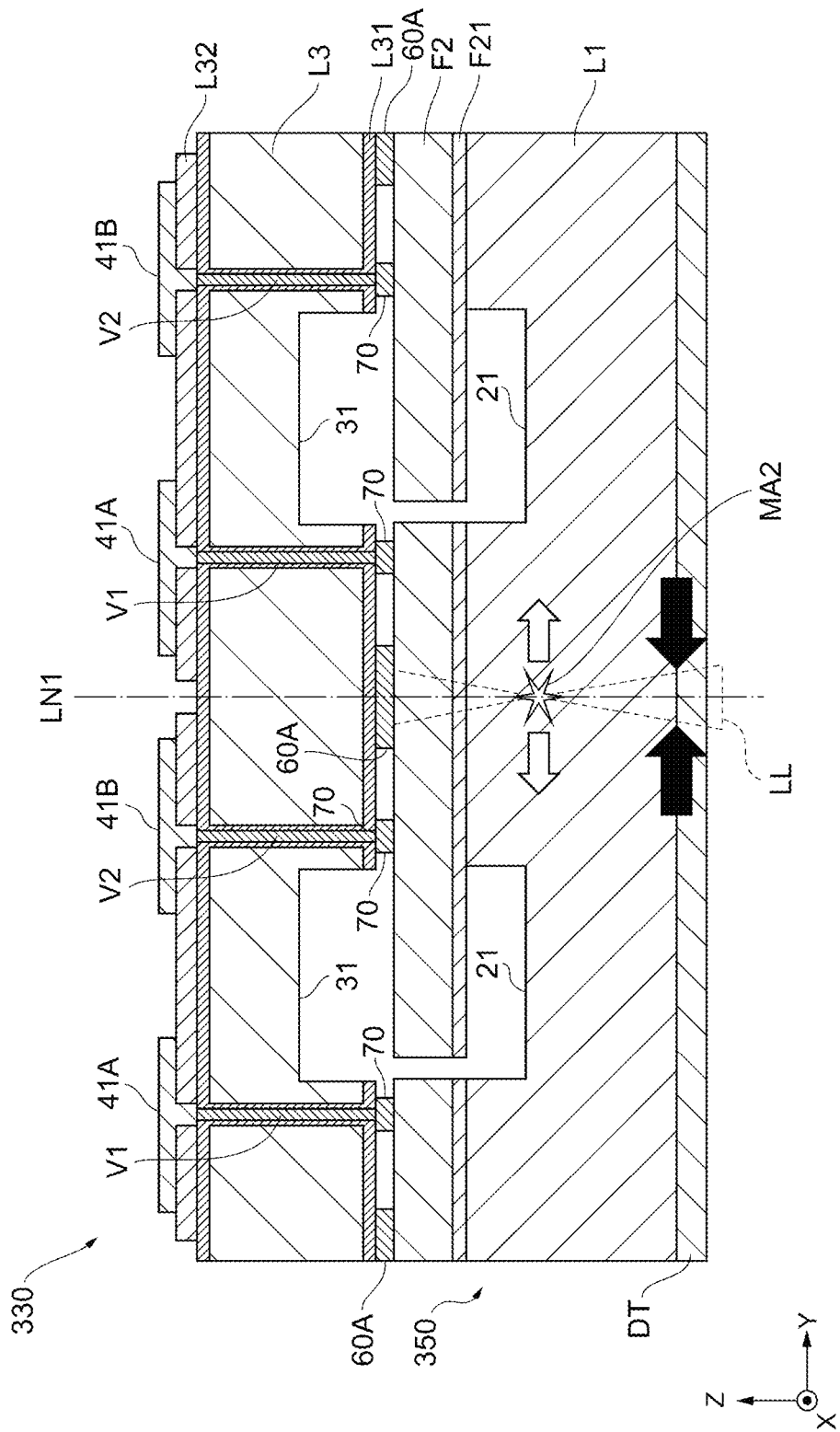
FIG. 14 is a sectional view illustrating a step depicted in FIG. 13.
Figure 15:
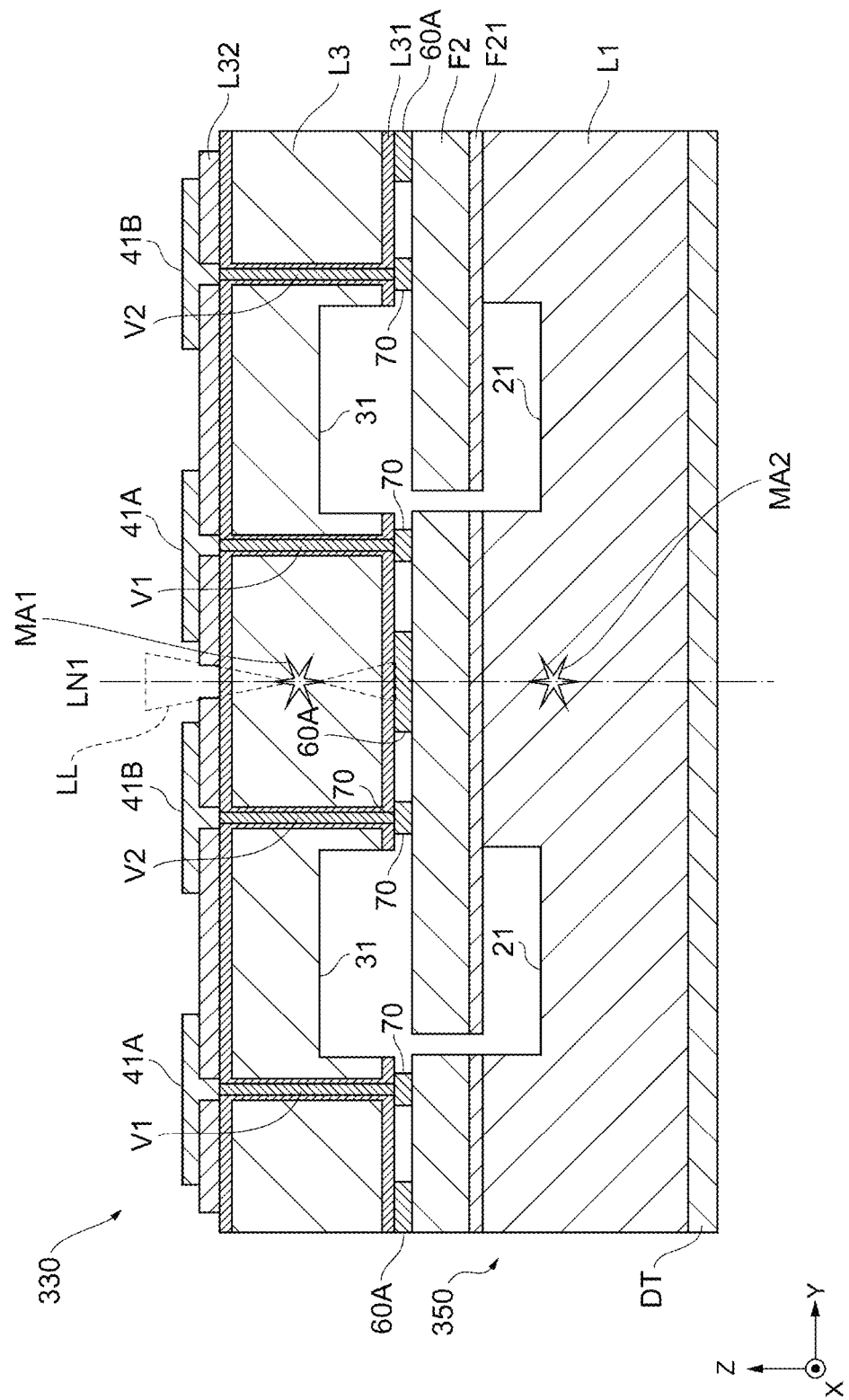
FIG. 15 is a sectional view illustrating a step depicted in FIG. 13.

First, a MEMS device manufacturing method according to the second exemplary embodiment will be described while referring to FIGS. 13 to 15. FIG. 13 is a flowchart illustrating a method of manufacturing a resonance device 1 according to the second embodiment. FIG. 14 is a sectional view illustrating a step S311 depicted in FIG. 13. FIG. 15 is a sectional view illustrating a step S312 depicted in FIG. 13. In FIGS. 14 to 15, for the sake of convenience, some of a plurality of the resonance devices 1 produced by the manufacturing method are illustrated and will be described.

As illustrated in FIG. 13, the method of manufacturing the resonance device 1 according to the second embodiment differs from the method of manufacturing the resonance device 1 according to the first embodiment described above in that after the dicing tape DT is stuck to the bottom surface of the second substrate 350 in step S304, the order in which the modified regions MA1 of the first substrate 330 and the modified regions MA2 of the second substrate 350 are formed is reversed.

In other words, first, laser light LL is radiated from the bottom surface side of the second substrate 350 so that the modified regions MA2 are formed inside the second substrate 350 along the dividing lines LN1 and LN2 (S311).

As illustrated in FIG. 14, the laser light LL radiated from the bottom surface side of the second substrate 350 is partially absorbed inside the second substrate 350 and the modified region MA2 is formed around the focal point position.

Then, the modified regions MA2 can be formed along the dividing lines LN1 inside the second substrate 350 by moving either the laser light LL or the second substrate 350 in a direction parallel to the X axis direction along the dividing line LN1. Similarly, the modified regions MA2 can be formed along the dividing line LN2 inside the second substrate 350 by moving either the laser light LL or the second substrate 350 in a direction parallel to the Y axis direction along the dividing line LN2.

When the modified regions MA2 are formed, stress is generated originating from the modified regions MA2. This stress acts in directions such that the second substrate 350 expands (e.g., in directions parallel to Y axis) as indicated by the white arrows in FIG. 14. When the modified regions MA1 are formed along the dividing lines LN1 and LN2 inside the first substrate 330 first as in the first embodiment, there is a risk of the first substrate 330 warping due to the stress acting in directions in which the first substrate 330 expands as described above. Therefore, it is possible to cancel out the stress acting in directions in which the second substrate 350 expands originating from the modified regions MA2 with the adhesive force of the dicing tape DT indicated by the black arrows in FIG. 14 by sticking the dicing tape DT to the bottom surface of the second substrate 350 and then forming the modified regions MA2 inside the second substrate 350 by radiating the laser light from the bottom surface side of the second substrate prior to forming the modified regions MA1 inside the first substrate 330. Therefore, warping of the second substrate 350 can be suppressed and focus measurement errors and the like occurring when radiating the laser light LL that are caused by such warping can be reduced.

The resonance device 1 according to the second embodiment differs from the resonance device 1 according to the first embodiment in that bonding portions 60A do not have openings.

The laser light LL that is not absorbed inside the second substrate 350 attempts to pass through the second substrate 350 and be incident on the bottom surface of the first substrate 330. This laser light LL is completely blocked by the bonding portions 60A formed along the dividing line LN1.

Returning to FIG. 13, next, laser light LL is radiated from the top surface side of the first substrate 330 so that modified regions MA1 are formed inside the first substrate 330 along the dividing lines LN1 and LN2 (S312).

As illustrated in FIG. 15, the laser light LL radiated from the top surface side of the first substrate 330 is partially absorbed inside the first substrate 330 and the modified region MA1 is formed.

Then, the modified regions MA1 can be formed along the dividing line LN1 inside the first substrate 330 by moving either the laser light LL or the first substrate 330 in a direction parallel to the X axis direction along the dividing line LN1. Similarly, the modified regions MA1 can be formed along the dividing line LN2 inside the first substrate 330 by moving either the laser light LL or the first substrate 330 in a direction parallel to the Y axis direction along the dividing line LN2.

Therefore, compared with the case where the modified regions MA1 are formed inside the first substrate 330 before forming the modified regions MA2 inside the second substrate 350 as in the first embodiment, warping of the first substrate 330 can be suppressed by radiating the laser light LL from the bottom surface side of the second substrate 350 to form the modified regions MA2 inside the second substrate 350 and then radiating the laser light LL from the top surface side of the first substrate 330 to form the modified regions MA1 inside the first substrate 330 along the dividing lines LN1 and LN2. Furthermore, the first substrate is easier to divide as a result of stress acting on the modified regions MA1 of the first substrate 330.

The laser light LL that is not absorbed inside the second substrate 350 attempts to pass through the second substrate 350 and be incident on the bottom surface of the first substrate 330. This laser light LL is completely blocked by the bonding portions 60A formed along the dividing line LN1.

Figure 16:
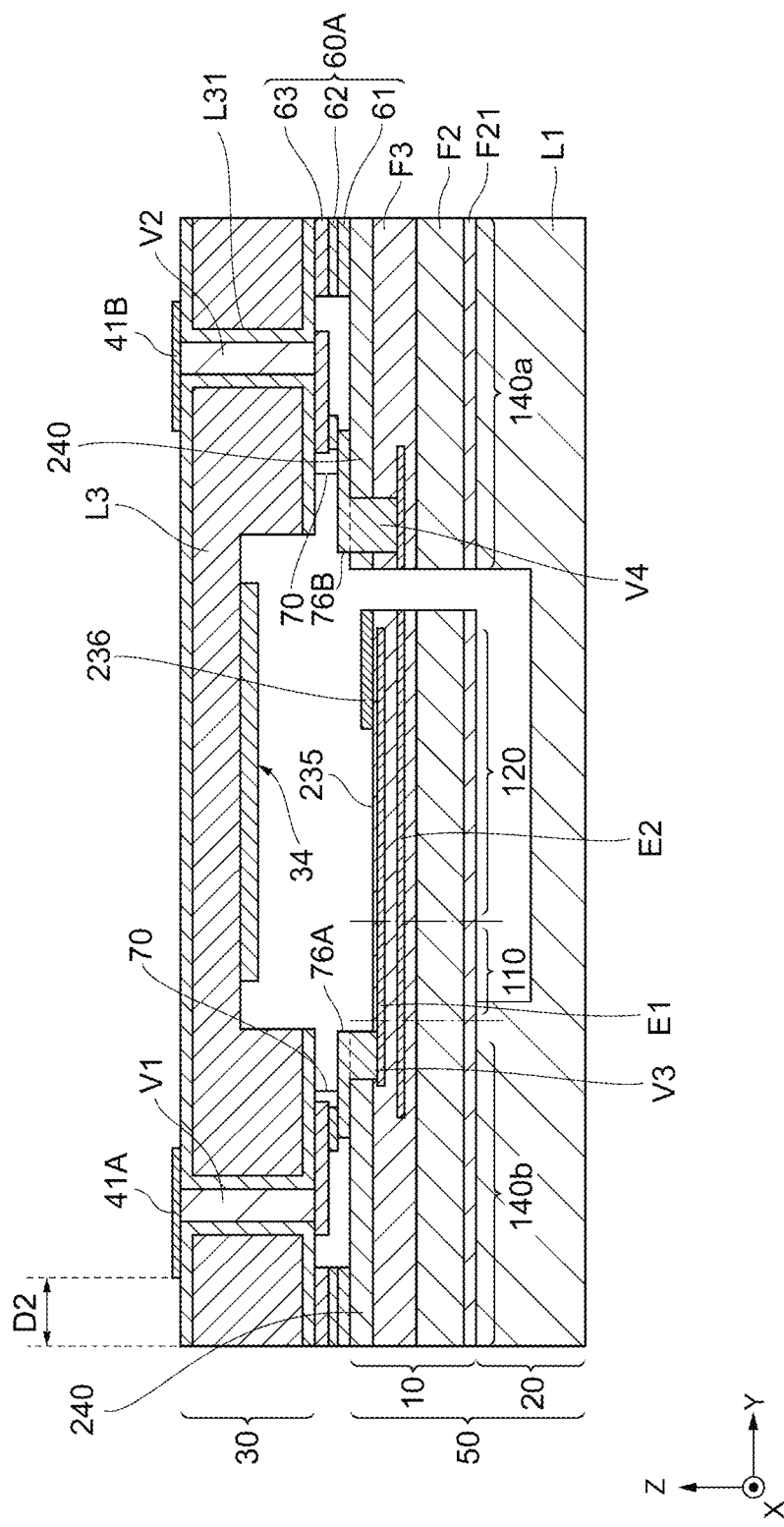
FIG. 16 is a sectional view schematically illustrating the configuration of the resonance device according to the second embodiment.

Next, the MEMS device according to the second embodiment will be described while referring to FIG. 16. FIG. 16 is a sectional view schematically illustrating the configuration of the resonance device 1 according to the second exemplary embodiment. FIG. 16 is the same sectional view as FIG. 12.

As illustrated in FIG. 16, the bonding portions 60A differ from the bonding portions 60 of the resonance device 1 according to the first embodiment in that the bonding portions 60A are arranged on the top surface of the MEMS substrate 50 (bottom cover 20 and resonator 10) without a distance being left from the outer edge. In other words, in this embodiment, the first distance D1 of the bonding portions 60 illustrated in FIG. 12 is zero.

In general, it is noted that exemplary embodiments of the present invention have been described above. In a method of manufacturing a resonance device according to an exemplary embodiment, bonding portions are formed along dividing lines and the bonding portions block laser light radiated from the bottom surface side of a second substrate. This process enables the amount of laser light not absorbed inside the second substrate and incident on a first substrate to be reduced. Therefore, it is possible to suppress damage to device parts such as electrode pads formed on the first substrate caused by the laser light.

In addition, in the above-described manufacturing method, it is possible to cancel out stress acting in directions in which the second substrate expands originating from the modified regions with the adhesive force of the dicing tape indicated by the black arrows in FIG. 14 by sticking the dicing tape to the bottom surface of the second substrate and then forming the modified regions inside the second substrate by radiating the laser light from the bottom surface side of the second substrate prior to forming the modified regions inside the first substrate. Therefore, warping of the second substrate can be suppressed and focus measurement errors and the like occurring when radiating the laser light caused by such warping can be reduced.

In addition, in the above-described manufacturing method, the modified regions are formed inside the second substrate by radiating laser light from the bottom surface side of the second substrate and then the laser light is radiated from the top surface side of the first substrate in order to form the modified regions inside the first substrate along the dividing lines. As a result, warping of the first substrate can be suppressed compared with the case where the modified regions are formed inside the first substrate before the modified regions are formed inside the second substrate. Furthermore, the first substrate is easier to divide as a result of stress acting on the modified regions of the first substrate.

In addition, in the above-described manufacturing method, the bonding portions have openings that are formed along parts of the dividing lines. This configuration suppresses dividing defects that may occur when dividing the first substrate and the second substrate along the dividing lines.

In addition, in the above-described manufacturing method, the width of the dividing lines at the top surface of the first substrate is 5 to 20 μm in an exemplary aspect. This configuration enables the resonance devices to be reduced in size and the number of obtained resonance devices to be increased when the first substrate and the second substrate are divided along the dividing lines to form the individual resonance devices (chips). Furthermore, the width of the openings at the top surface of the second substrate is less than or equal to 20 μm. This configuration enables both blocking of laser light and suppression of division defects to be realized.

In addition, in the above-described manufacturing method, the distance of the electrode pads from the dividing lines on the top surface of the first substrate is larger than ½ the width of the openings. Thus, the electrode pads are arranged outside the openings with respect to the dividing lines, and therefore even if the laser light radiated along the dividing lines from the bottom surface side of the second substrate passes through the openings, the possibility of the laser light acting on the electrode pads formed on the top surface of the first substrate or on the resin film formed therebelow can be reduced. Therefore, the exemplary method further suppresses damage to the electrode pads formed on the first substrate caused by laser light.

In addition, in the above-described manufacturing method, the distance of the electrode pads from the dividing lines on the top surface of the first substrate is greater than or equal to ⅙ the thickness (length in Z axis direction) of the first substrate. This configuration makes it possible to prevent the electrode pads from interfering with the laser light radiated along the dividing lines from the top surface side of the first substrate.

In the resonance device according to an exemplary embodiment, the material of the bonding portions 60 is a metal constructed for blocking the laser light LL that is able to pass through the top cover 30 and the MEMS substrate 50 (bottom cover 20 and resonator 10). As a result, the laser light LL radiated from the bottom surface side of the MEMS substrate 50 (bottom cover 20 and resonator 10) when dividing the substrates can be blocked by the bonding portions 60 and the amount of light incident on the top cover 30 can be reduced. Therefore, damage to device parts such as the electrode pads 41A to 41D formed on the top cover 30 can be suppressed that would otherwise be caused by the laser light LL.

Furthermore, in the above-described resonance device, the bonding portions are arranged at a first distance from the outer edge on the top surface of the MEMS substrate (bottom cover and resonator). This configuration suppresses manufacturing defects from occurring in the resonance device such as protrusions (burrs) accompanying division defects that may occur when the bonding portions are arranged without the first distance.

In addition, in the above-described resonance device, the first distance D1 is less than or equal to 20 μm. This configuration enables both blocking of the laser light and suppressing of manufacturing defects in the resonance devices to be realized.

Furthermore, in the above-described resonance device, the electrode pads are arranged at a second distance, which is larger than the first distance, from the outer edge on the top surface of the top cover (first distance<second distance). As a result, since the electrode pads are disposed further toward the inside than the bonding portions with respect to the outer edge, the possibility of the laser light radiated from the bottom surface side of the MEMS substrate (bottom cover and resonator) acting on the electrode pads when dividing the substrates can be reduced. Therefore, it is possible to further suppress damage to the electrode pads formed on the top cover caused by the laser light.

Furthermore, in the above-described resonance device, the second distance is greater than or equal to ⅙ the thickness (length in Z axis direction) of the top cover. This configuration makes to possible to prevent the electrode pads from interfering with the laser light radiated from the top surface side of the top cover when dividing the substrates.

It is noted that the exemplary embodiments described above are provided to facilitate an understanding of the present invention and the embodiments are not to be interpreted as limiting the present invention. Instead, the exemplary embodiments can be modified or improved without departing from the gist of the invention and equivalents to the present invention are also included in the present invention. In other words, appropriate design changes made to the embodiments by those skilled in the art are included in the scope of the present invention so long as the changes have the characteristics of the present invention. For example, the elements included in the embodiments and the arrangements, materials, conditions, shapes, sizes and so forth of the elements are not limited to those exemplified in the embodiments and can be changed as appropriate. In addition, each embodiment is merely an illustrative example and it goes without saying that parts of the configurations illustrated in different embodiments can be substituted for each other or combined with each other and these new configurations are also included in the scope of the present invention so long as the configurations have the characteristics of the present invention.

REFERENCE SIGNS LIST

1 . . . resonance device, 10 . . . resonator, 20 . . . bottom cover, 21 . . . rear surface, 21 . . . recess, 22 . . . bottom plate, 23 . . . side wall, 30 . . . top cover, 31 . . . recess, 33 . . . side wall, 34 . . . getter layer, 41A, 41B, 41C, 41D . . . electrode pad, 50 . . . MEMS substrate, 60, 60A bonding portion, 61 . . . aluminum layer, 62 . . . germanium layer, 63 . . . aluminum (Al) layer, 65 . . . opening, 70 . . . connection wiring line, 76A, 76B . . . contact electrode, 110 . . . holding arm, 120 . . . vibrating portion, 130 base portion, 131*a* . . . long side, 131A . . . front end, 131*b* long side, 131B . . . rear end, 131*c*, 131*d* . . . short side, 135, 135A, 135B, 135C, 135D . . . vibrating arm, 140 . . . holding portion, 235 . . . protective film, 236 . . . frequency-adjusting film, 240 . . . parasitic capacitance reducing film, 330 . . . first substrate, 350 . . . second substrate, AW . . . width, D1 . . . first distance, D2 . . . second distance, DT . . . dicing tape, E1, E2 . . . metal layer, F2 . . . Si substrate, F3 . . . piezoelectric thin film, F21 . . . silicon oxide layer, G . . . weight portion, L1 . . . Si wafer, L3 . . . Si wafer, L31 . . . silicon oxide film, L32 . . . resin film, LL . . . laser light, LN1, LN2 . . . dividing line, MA1, MA2 . . . modified region, P . . . virtual plane, PD . . . distance, V1, V2 . . . through electrode, V3, V4 . . . via.

The invention claimed is:

1. A MEMS device manufacturing method comprising:
   radiating laser light from a second main surface side of a second substrate to form a modified region inside the second substrate along a dividing line of the second substrate and a first substrate that has a device part disposed on a first main surface thereof;
   bonding a first main surface of the second substrate to a second main surface of the first substrate via a bonding portion that is formed along the dividing line, with the bonding portion constructed to block at least a portion of the laser light; and
   applying stress to the modified region of the second substrate to divide the first substrate and the second substrate,
   wherein the device part includes a plurality of electrode pads and the method further comprises disposing the plurality of electrode pads on the device part, such that each electrode pad is disposed at a distance from the dividing line at the first main surface of the first substrate and none of the plurality of electrode pads overlap the dividing line in a direction orthogonal to the first main surface.

2. The MEMS device manufacturing method according to claim 1, further comprising applying dicing tape to the second main surface of the second substrate before radiating the laser light to form the modified region of the second substrate.

3. The MEMS device manufacturing method according to claim 1, further comprising radiating the laser light from the first main surface side of the first substrate to form a modified region inside the first substrate along the dividing line after radiating the laser light to form the modified region of the second substrate.

4. The MEMS device manufacturing method according to claim 1, further comprising forming an opening in the bonding portion along part of the dividing line.

5. The MEMS device manufacturing method according to claim 4, further comprising forming the dividing line at the first main surface of the first substrate to have a width that is 5 to 20 μm.

6. The MEMS device manufacturing method according to claim 5, further comprising forming the opening at the first main surface of the second substrate to have a width that is less than or equal to 20 μm.

7. The MEMS device manufacturing method according to claim 1, further comprising disposing each electrode pad at a distance from the dividing line at the first main surface of the first substrate that is greater than ½ the width of the opening.

8. The MEMS device manufacturing method according to claim 7, further comprising disposing each electrode pad at a distance from the dividing line on the first main surface of the first substrate that is greater than or equal to than ⅙ a thickness of the first substrate.

9. The MEMS device manufacturing method according to claim 1, wherein the dividing line extends in the direction orthogonal to the respective main surfaces of the first and second substrates.

10. A MEMS device manufacturing method comprising:
   radiating laser light from a first surface side of a first substrate to form a modified region inside the first substrate along a dividing line that extends in a direction perpendicular to the first surface side;
   bonding a main surface of a second substrate to a main surface of the first substrate via a bonding portion that is formed along the dividing line, with the bonding portion constructed to block at least a portion of the laser light;
   applying stress to the modified region of the first substrate to collectively divide the first substrate and the second substrate; and
   disposing a device part with a plurality of electrode pads in the first main surface of the substrate, such that each of the plurality of electrode pads are disposed at a distance from the dividing line at the first main surface of the first substrate and none of the plurality of electrode pads overlap the dividing line in a direction orthogonal to the first main surface.

11. The MEMS device manufacturing method according to claim 10, further comprising forming an opening in the bonding portion along part of the dividing line.

12. The MEMS device manufacturing method according to claim 11, further comprising disposing the device part at a distance from the dividing line at the first main surface of the first substrate that is greater than ½ the width of the opening.

13. The MEMS device manufacturing method according to claim 10, wherein the dividing line extends in the direction orthogonal to the respective main surfaces of the first and second substrates.

* * * * *